United States Patent
Chien et al.

(10) Patent No.: US 9,237,358 B2
(45) Date of Patent: Jan. 12, 2016

(54) CONTEXT REDUCTION FOR CONTEXT ADAPTIVE BINARY ARITHMETIC CODING

(71) Applicant: Qualcomm Incorporated, San Diego, CA (US)

(72) Inventors: Wei-Jung Chien, San Diego, CA (US); Joel Sole Rojals, La Jolla, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 416 days.

(21) Appl. No.: 13/645,296

(22) Filed: Oct. 4, 2012

(65) Prior Publication Data

US 2013/0114671 A1    May 9, 2013

Related U.S. Application Data

(60) Provisional application No. 61/557,325, filed on Nov. 8, 2011, provisional application No. 61/561,911, filed on Nov. 20, 2011.

(51) Int. Cl.
| | |
|---|---|
| *H04N 19/103* | (2014.01) |
| *H04N 19/136* | (2014.01) |
| *H04N 19/174* | (2014.01) |
| *H04N 19/60* | (2014.01) |
| *H03M 7/40* | (2006.01) |
| *H04N 19/13* | (2014.01) |
| *H04N 19/91* | (2014.01) |
| *H04N 19/50* | (2014.01) |
| *H04N 19/176* | (2014.01) |

(52) U.S. Cl.
CPC ............ *H04N 19/60* (2014.11); *H03M 7/4018* (2013.01); *H04N 19/103* (2014.11); *H04N 19/13* (2014.11); *H04N 19/136* (2014.11); *H04N 19/174* (2014.11); *H04N 19/176* (2014.11); *H04N 19/50* (2014.11); *H04N 19/91* (2014.11)

(58) Field of Classification Search
None
See application file for complete search history.

(56) References Cited

U.S. PATENT DOCUMENTS

| | | | | |
|---|---|---|---|---|
| 5,917,943 | A  * | 6/1999 | Washizawa | 382/190 |
| 7,688,234 | B2 * | 3/2010 | Koo | 341/107 |
| 7,796,065 | B2 * | 9/2010 | Fenney | 341/107 |
| 7,961,122 | B1   | 6/2011 | Lin | |
| 7,982,641 | B1 * | 7/2011 | Su et al. | 341/107 |
| 2003/0058238 | A1 | 3/2003 | Doak et al. | |
| 2004/0240559 | A1 | 12/2004 | Prakasam et al. | |
| 2004/0268329 | A1 | 12/2004 | Prakasam | |

(Continued)

FOREIGN PATENT DOCUMENTS

WO    2004100556 A2    11/2004

OTHER PUBLICATIONS

"Test Model under Consideration (draft007)," MPEG Meeting; Dresden; (Motion Picture Expert Group or ISO/IEC JTC1/SC29/WG11), No. w11280, Apr. 2010, 152 pp.

(Continued)

*Primary Examiner* — Jay Patel
*Assistant Examiner* — Reza Aghevli
(74) *Attorney, Agent, or Firm* — Shumaker & Sieffert, P.A.

(57) ABSTRACT

A reduction in the number of binarizations and/or contexts used in context adaptive binary arithmetic coding (CABAC) for video coding is proposed. In particular, this disclosure proposes techniques that may lower the number contexts used in CABAC by up to 56.

32 Claims, 10 Drawing Sheets

(56) References Cited

U.S. PATENT DOCUMENTS

| | | | |
|---|---|---|---|
| 2005/0038837 | A1 | 2/2005 | Marpe et al. |
| 2005/0152452 | A1 | 7/2005 | Suzuki |
| 2005/0169374 | A1* | 8/2005 | Marpe et al. ............ 375/240.16 |
| 2005/0276448 | A1 | 12/2005 | Pryor |
| 2006/0083308 | A1 | 4/2006 | Schwarz et al. |
| 2006/0233240 | A1 | 10/2006 | Cha et al. |
| 2007/0063997 | A1 | 3/2007 | Scherer et al. |
| 2007/0121728 | A1 | 5/2007 | Wang et al. |
| 2008/0123972 | A1 | 5/2008 | Sekiguchi et al. |
| 2009/0002379 | A1 | 1/2009 | Baeza et al. |
| 2009/0003447 | A1 | 1/2009 | Christoffersen et al. |
| 2009/0168873 | A1 | 7/2009 | Jeon et al. |
| 2009/0273491 | A1 | 11/2009 | Sakaguchi et al. |
| 2010/0086027 | A1 | 4/2010 | Panchal et al. |
| 2010/0098155 | A1* | 4/2010 | Demircin et al. ........ 375/240.02 |
| 2010/0098157 | A1* | 4/2010 | Yang ........................ 375/240.12 |
| 2010/0177820 | A1* | 7/2010 | Chono et al. ............. 375/240.03 |
| 2011/0280314 | A1 | 11/2011 | Sankaran et al. |
| 2012/0230421 | A1 | 9/2012 | Chen et al. |
| 2013/0114672 | A1 | 5/2013 | Chien et al. |
| 2013/0114673 | A1 | 5/2013 | Chien et al. |
| 2014/0355669 | A1 | 12/2014 | Chien et al. |
| 2014/0355681 | A1 | 12/2014 | Chien et al. |

OTHER PUBLICATIONS

Bross et al., "WD4: Working Draft 4 of High-Efficiency Video Coding," JCT-VC Meeting; MPEG Meeting; Torino; (Joint Collaborative Team on Video Coding of ISO/IEC JTC1/SC29/WG11 and ITU-T SG.16); URL: http://wftp3.itu.int/av-arch/jctvc-site/, Document No. JCTVC-F803_d0, Jul. 14-22, 2011, 216 pp.

Bross et al., "High efficiency video coding (HEVC) text specification draft 6," Document No. JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.

Chien et al.,"Context reduction for CABAC," JCT-VC Meeting; MPEG Meeting; Geneva; (Joint Collaborative Team on Video Coding of ISO/I EC JTC1/SC29/WG11 and ITU-T SG. 16) ; URL: http://wftp3.itu.int/av-arch/jctvc-site/ Document No. JCTVC-G718, Nov. 21-30, 2011, 8 pp.

International Search Report and Written Opinion—PCT/US2012/059092—ISA/EPO—Mar. 26, 2013, 16 pp.

Nguyen et al., "Modified binarization and coding of MVD for PIPE/CABAC," JCT-VC Meeting; MPEG Meeting; Torino; (Joint Collaborative Team on Video Coding of ISO/IEC JTC1/SC29/WG11 and ITU-TSG. 16) ; URL: http://wftp3.itu.int/av-arch/jctvc-site/,, Document No. JCTVC-F455, Jul. 14-22, 2011, 2 pp.

Piao et al., "Unified Pred_type coding in CABAC," JCT-VC Meeting; MPEG Meeting; Geneva; (Joint Collaborative Team on Video Coding of ISO/IEC JTC1/SC29/WG11 and ITU-T SG.16); URL: http://wftp3.itu.int/av-arch/jctvc-site/ Document No. JCTVC-G785, Nov. 21-30, 2011, 3 pp.

Sasai et al.,"CE11: Context size reduction for the significance map (JCTVC-D185)," MPEG Meeting; Geneva; (Motion Picture Expert Group or ISO/IEC JTC1/SC291WG11), , Document No. JCTVC-E227, WG11 No. m19750, Mar. 16-23, 2011, 6 pp.

Sze "BoG report on context reduction for CABAC," JCT-VC Meeting; MPEG Meeting; Torino; (Joint Collaborative Team on Video Coding of ISO/IEC JTC1/SC29/WG11 and ITU-TSG. 16) ; URL: http://wftp3.itu.int/av-arch/jctvc-site/,, Document No. JCTVC-F746, Jul. 14-22, 2011, 7 pp.

Zhang et al., "Prediction and partition mode binarization for Low Delay P," JCT-VC Meeting; MPEG Meeting; Geneva; (Joint Collaborative Team on Video Coding of ISO/IEC JTC1/SC29/WG11 and ITU-T SG.16 ); URL: http://wftp3.itu.int/av-arch/jctvc-site/ Document No. JCTVC-G151, Nov. 21-30, 2011, 4 pp.

International Preliminary Report on Patentability from international application No. PCT/US2012/059092, mailed May 22, 2014, 11 pp.

ITU-T H.265, Series H: Audiovisual and Multimedia Systems, Infrastructure of audiovisual services—Coding of moving video, High efficiency video coding, The International Telecommunication Union, Apr. 2013, 317 pp.

Bross et al., "High efficiency video coding (HEVC) text specification draft 9," 11th Meeting: Shanghai, CN, Oct. 10-19, 2012, JCTVC-K1003_v7, 290 pp.

Bross et al., "High efficiency video coding (HEVC) text specification draft 10 (for FDIS & Last Call)," 12th Meeting: Geneva, CH, Jan. 14-23, 2013, JCTVC-L1003_v34, 310 pp.

Wiegand et al., "WD1: Working Draft 1 of High-Efficiency Video Coding", JCTVC-C403, 3rd Meeting: Guangzhou, CN, Oct. 7-15, 2010, 137 pp.

Wiegand et al., "WD2: Working Draft 2 of High-Efficiency Video Coding," JCTVC-D503, Jan. 20-28, 2011, 153 pp.

Wiegand et al., "WD3: Working Draft 3 of High-Efficiency Video Coding," Document JCTVC-E603, 5th Meeting: Geneva, CH, Mar. 16-23, 2011,193 pp.

Bross et al., "WD4: Working Draft 4 of High-Efficiency Video Coding," 6th Meeting: JCTVC-F803_d2, Torino, IT, Jul. 14-22, 2011, 226 pp.

Bross et al., "WD5: Working Draft 5 of High-Efficiency Video Coding," 7th Meeting: Geneva, Switzerland, Nov. 2011, JCTVC-G1103_d2, 214 pp.

Bross et al., "High efficiency video coding (HEVC) text specification draft 6," 7th Meeting: Geneva, CH, Nov. 21-30, 2011, JCTVC-H1003, 259 pp.

Bross et al., "High efficiency video coding (HEVC) text specification draft 7," 9th Meeting: Geneva, CH, Apr. 27-May 7, 2012, JCTVC-I1003_d21, 290 pp.

Bross et al., "High efficiency video coding (HEVC) text specification draft 8," 10th Meeting: Stockholm, SE, Jul. 11-20, 2012, JCTVC-J1003_d7, 261 pp.

ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.

Alshin et al., "Multi-parameter probability up-date for CABAC," Joint Collaborative Team on Video Coding (JCT-VC) of ITU-T SG16 WP3 and ISO/IEC JTC1/SC29/WG11 6th Meeting: Torino, IT, Jul. 14-22, 2011, JCTVC-F254, pp. 1-5.

Amonou et al., "Description of video coding technology proposal by France Telecom, NTT, NTT DOCOMO, Panasonic and Technicolor," ITU-T SG16 WP3 and ISOIIEC JTCIISC29NVG11, Document JCTVC-A114, Dresden, DE, Apr. 15-23, 2010, 42 page.

Bossen, "Common test conditions and software reference configurations," JCTVC-F900, ITU-T SG16 WP3 and ISO/IEC JTC1/SC29/WG11, 6th Meeting: Torino, IT, Jul. 14-22, 2011, 3 pages.

U.S. Appl. No. 13/645,308, by Wei-Jung Chien, filed Oct. 4, 2012.

U.S. Appl. No. 13/645,330, by Wei-Jung Chien, filed Oct. 4, 2012.

European Communication from counterpart European Application No. 12 791 589.0, dated Mar. 13, 2015, 8 p.

"Select, Japanese dictionary—excite dictionary," retrieved on Jun. 15, 2015 from http://www.excite.co.jp/dictionary/japanese/?search=%E9%81%B8%E6%8A%9E&match=beginswith&itemid=DJR_senntaku_-040, [online], 4 pp.

"ITU-T H.265, Series H: Audiovisual and Multimedia Systems, Infrastructure of audiovisual services—Coding of moving video, High efficiency video coding," The International Telecommunication Union, Oct. 2014, 540 pp.

Karwowski: "Advanced Adaptation Algorithms of Arithmetic Coding in Hybrid Video Compression," 2008, retrieved from Internet, URL: http:www.multimedia.edu.pl/publications/PhD/dkarwowski.pdf, downloaded Jan. 14, 2015, 277 pp.

\* cited by examiner

CONTEXT REDUCTION FOR CONTEXT ADAPTIVE BINARY ARITHMETIC CODING

This application claims the benefit of U.S. Provisional Application No. 61/557,325, filed Nov. 8, 2011, and U.S. Provisional Application No. 61/561,911, filed Nov. 20, 2011, both of which are hereby incorporated by reference in their entirety.

TECHNICAL FIELD

This disclosure relates to video coding, and in particular to context adaptive binary arithmetic coding (CABAC) used in video coding.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards. The video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video picture or a portion of a video picture) may be partitioned into video blocks, which may also be referred to as treeblocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to a reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in order to produce a one-dimensional vector of transform coefficients, and entropy coding may be applied to achieve even more compression.

SUMMARY

In general, this disclosure describes techniques for context adaptive binary arithmetic coding (CABAC) in a video coding process. In particular, this disclosure proposes a reduction in the number of CABAC contexts used for one or more syntax elements, non-limiting examples of which include pred_type, merge_idx, inter_pred_flag, ref_idx_lx, cbf_cb, cbf_cr, coeff_abs_level_greater1_flag, and coeff_abs_level_greater2_flag. The modifications may reduce up to 56 contexts with negligible coding efficiency changes. The proposed context reductions for the syntax elements may be used alone or in any combination.

In one example of the disclosure, a method of encoding video may include determining a first prediction type for a block of video data in a P slice, representing the first prediction type as a P-slice prediction type syntax element, determining a second prediction type for a block of video data in a B slice, representing the second prediction type as a B-slice prediction type syntax element, determining a P-slice binarization for the P-slice prediction type syntax element, determining a B-slice binarization for the B-slice prediction type syntax element, wherein the P-slice prediction type syntax element and the B-slice prediction type syntax element are determined using the same binarization logic, and encoding the video data based on the binarizations of the P-slice prediction type syntax element and the B-slice prediction syntax element.

In another example of the disclosure, a method of decoding video may include mapping a binarized P-slice prediction type syntax element to a prediction type using a binarization mapping for a block of video data in a P slice, mapping a binarized B-slice prediction type syntax element to a prediction type using the same binarization mapping for a block of video data in a B slice, and decoding the video data based on the mapped prediction types.

In another example of the disclosure, a method of encoding video data comprises determining a partition type for a prediction mode for a block of video data, encoding a partition type bin of a prediction type syntax element for a block of video data using CABAC with a single context, wherein the single context is the same for any partition type, and encoding a partition size bin of the prediction type syntax element for the block of video data using CABAC in bypass mode.

In another example of the disclosure, a method of decoding video data comprises receiving a prediction type syntax element for a block of video data that has been coded using CABAC, the prediction type syntax element including a partition type bin representing a partition type and a partition size bin representing a partition size, decoding the partition type bin of the prediction type syntax element using context adaptive binary arithmetic coding with a single context, wherein the single context is the same for any partition type, and decoding the partition size bin of the prediction type syntax element using CABAC in bypass mode.

In another example of the disclosure, a method of coding video data comprises coding a Cb chroma coded block flag for a block of video data using CABAC, wherein coding the Cb chroma coded block flag comprises using a context set including one or more contexts as part of the CABAC, and coding a Cr chroma coded block flag using CABAC, wherein coding the Cr chroma coded block flag comprises using the same context set as the Cb chroma coded block flag as part of the CABAC.

This disclosure also describes the above techniques in terms of apparatuses configured to perform the techniques as well as in terms of a computer-readable storage medium storing instructions that, when executed, cause one or more processors to perform the techniques.

The details of one or more examples are set forth in the accompanying drawings and the description below. Other features, objects, and advantages will be apparent from the description and drawings, and from the claims.

DETAILED DESCRIPTION

This disclosure describes techniques for coding data, such a video data. In particular, the disclosure describes techniques that may promote efficient coding of video data using context adaptive entropy coding processes. More specifically, this disclosure proposes a reduction in the number of CABAC contexts used for coding syntax elements, such as, pred_type, merge_idx, inter_pred_flag, ref_idx_lx, cbf_cb, cbf_cr, coeff_abs_level_greater1_flag, and coeff_abs_level_greater2_flag. The modifications reduce up to 56 contexts with negligible coding efficiency changes. This disclosure describes video coding for purposes of illustration. However, the techniques described in this disclosure may be applicable to coding other types of data as well.

Figure 1:
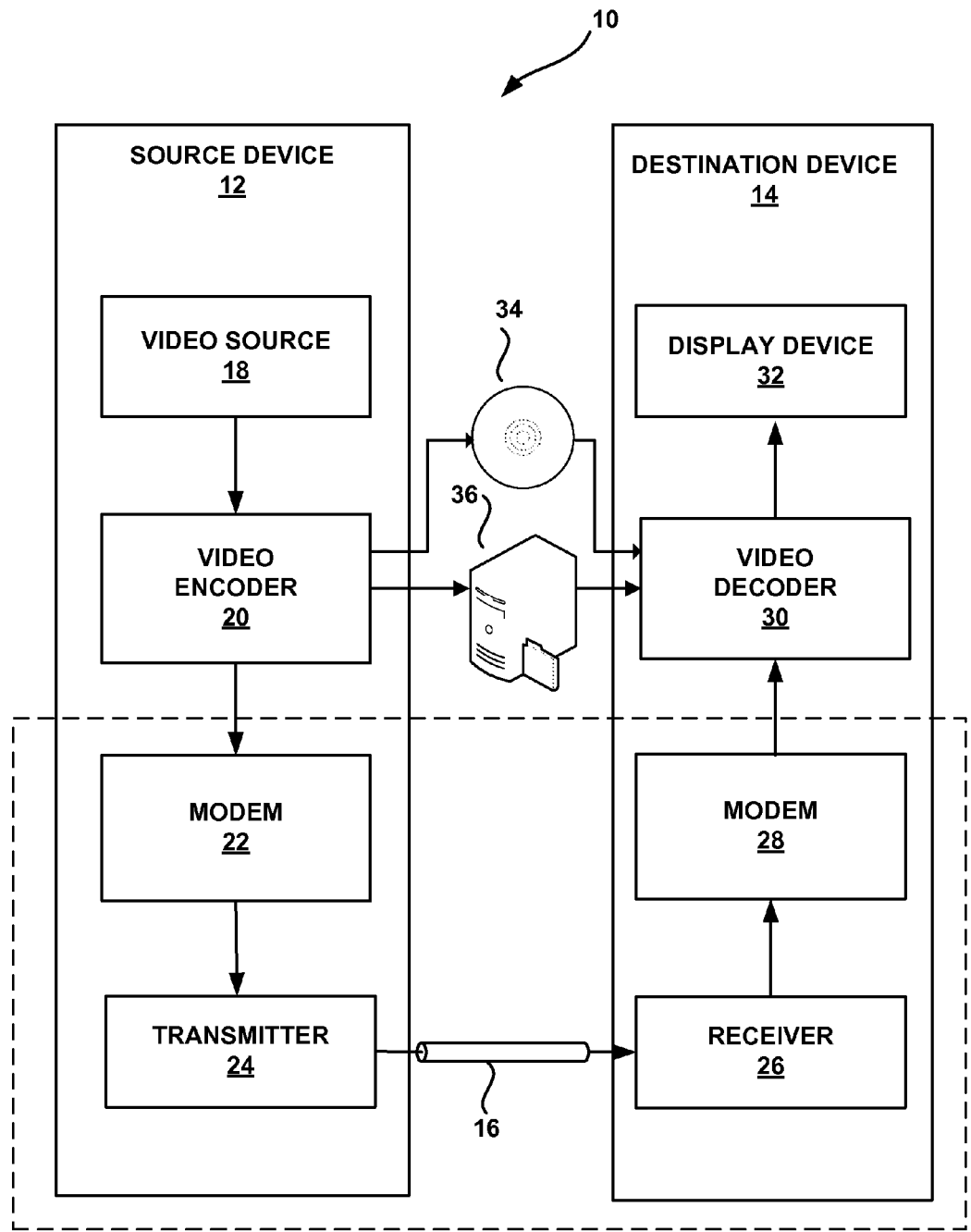
FIG. 1 is a block diagram illustrating an example video encoding and decoding system that may utilize the techniques described in this disclosure.

FIG. 1 is a block diagram illustrating an example video encoding and decoding system 10 that may be configured to utilize techniques for context adaptive binary arithmetic coding (CABAC) in accordance with examples of this disclosure. As shown in FIG. 1, system 10 includes source device 12 that transmits encoded video to destination device 14 via communication channel 16. Encoded video data may also be stored on storage medium 34 or file server 36 and may be accessed by destination device 14 as desired. When stored to a storage medium or file server, video encoder 20 may provide coded video data to another device, such as a network interface, a compact disc (CD), Blu-ray or digital video disc (DVD) burner or stamping facility device, or other devices, for storing the coded video data to the storage medium. Likewise, a device separate from video decoder 30, such as a network interface, CD or DVD reader, or the like, may retrieve coded video data from a storage medium and provided the retrieved data to video decoder 30.

Source device 12 and destination device 14 may comprise any of a wide variety of devices, including desktop computers, notebook (i.e., laptop) computers, tablet computers, set-top boxes, telephone handsets such as so-called smartphones, televisions, cameras, display devices, digital media players, video gaming consoles, or the like. In many cases, such devices may be equipped for wireless communication. Hence, communication channel 16 may comprise a wireless channel, a wired channel, or a combination of wireless and wired channels suitable for transmission of encoded video data. Similarly, file server 36 may be accessed by destination device 14 through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server.

Techniques for CABAC, in accordance with examples of this disclosure, may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, system 10 may be configured to support one-way or two-way video transmission to support applications such as video streaming, video playback, video broadcasting, and/or video telephony.

In the example of FIG. 1, source device 12 includes video source 18, video encoder 20, modulator/demodulator 22 and transmitter 24. In source device 12, video source 18 may include a source such as a video capture device, such as a video camera, a video archive containing previously captured video, a video feed interface to receive video from a video content provider, and/or a computer graphics system for generating computer graphics data as the source video, or a combination of such sources. As one example, if video source 18 is a video camera, source device 12 and destination device 14 may form so-called camera phones or video phones. However, the techniques described in this disclosure may be applicable to video coding in general, and may be applied to wireless and/or wired applications, or application in which encoded video data is stored on a local disk.

The captured, pre-captured, or computer-generated video may be encoded by video encoder 20. The encoded video information may be modulated by modem 22 according to a communication standard, such as a wireless communication protocol, and transmitted to destination device 14 via transmitter 24. Modem 22 may include various mixers, filters, amplifiers or other components designed for signal modulation. Transmitter 24 may include circuits designed for transmitting data, including amplifiers, filters, and one or more antennas.

The captured, pre-captured, or computer-generated video that is encoded by video encoder 20 may also be stored onto storage medium 34 or file server 36 for later consumption. Storage medium 34 may include Blu-ray discs, DVDs, CD-ROMs, flash memory, or any other suitable digital storage media for storing encoded video. The encoded video stored on the storage medium 34 may then be accessed by destination device 14 for decoding and playback. Although not shown in FIG. 1, in some examples, storage medium 34 and/or file server 36 may store the output of transmitter 24.

File server 36 may be any type of server capable of storing encoded video and transmitting that encoded video to destination device 14. Example file servers include a web server (e.g., for a website), an FTP server, network attached storage (NAS) devices, a local disk drive, or any other type of device capable of storing encoded video data and transmitting it to a destination device. The transmission of encoded video data from file server 36 may be a streaming transmission, a download transmission, or a combination of both. File server 36 may be accessed by destination device 14 through any standard data connection, including an Internet connection. This may include a wireless channel (e.g., a Wi-Fi connection), a wired connection (e.g., DSL, cable modem, Ethernet, USB, etc.), or a combination of both that is suitable for accessing encoded video data stored on a file server.

Destination device 14, in the example of FIG. 1, includes receiver 26, modem 28, video decoder 30, and display device 32. Receiver 26 of destination device 14 receives information over channel 16, and modem 28 demodulates the information to produce a demodulated bitstream for video decoder 30. The information communicated over channel 16 may include a variety of syntax information generated by video encoder 20 for use by video decoder 30 in decoding video data. Such syntax may also be included with the encoded video data stored on storage medium 34 or file server 36. Each of video encoder 20 and video decoder 30 may form part of a respective encoder-decoder (CODEC) that is capable of encoding or decoding video data.

Display device 32 may be integrated with, or external to, destination device 14. In some examples, destination device 14 may include an integrated display device and also be configured to interface with an external display device. In other examples, destination device 14 may be a display device. In general, display device 32 displays the decoded video data to a user, and may comprise any of a variety of display devices such as a liquid crystal display (LCD), a plasma display, an organic light emitting diode (OLED) display, or another type of display device.

In the example of FIG. 1, communication channel 16 may comprise any wireless or wired communication medium, such as a radio frequency (RF) spectrum or one or more physical transmission lines, or any combination of wireless and wired media. Communication channel 16 may form part of a packet-based network, such as a local area network, a wide-area network, or a global network such as the Internet. Communication channel 16 generally represents any suitable communication medium, or collection of different communication media, for transmitting video data from source device 12 to destination device 14, including any suitable combination of wired or wireless media. Communication channel 16 may include routers, switches, base stations, or any other equipment that may be useful to facilitate communication from source device 12 to destination device 14.

Video encoder 20 and video decoder 30 may operate according to a video compression standard, such as the High Efficiency Video Coding (HEVC) standard presently under development by the Joint Collaboration Team on Video Coding (JCT-VC) of ITU-T Video Coding Experts Group (VCEG) and ISO/IEC Motion Picture Experts Group (MPEG). A recent draft of the HEVC standard, referred to as "HEVC Working Draft 6" or "WD6," is described in document JCTVC-H1003, Bross et al., "High efficiency video coding (HEVC) text specification draft 6," Joint Collaborative Team on Video Coding (JCT-VC) of ITU-T SG16 WP3 and ISO/IEC JTC1/SC29/WG11, 8th Meeting: San Jose, Calif., USA, February, 2012, which, as of Jun. 1, 2012, is downloadable from http://phenix.int-evry.fr/jct/doc_end_user/documents/8_San%20Jose/wg11/JCTVC-H1003-v22.zip.

Alternatively, video encoder 20 and video decoder 30 may operate according to other proprietary or industry standards, such as the ITU-T H.264 standard, alternatively referred to as MPEG 4, Part 10, Advanced Video Coding (AVC), or extensions of such standards. The techniques of this disclosure, however, are not limited to any particular coding standard. Other examples include MPEG-2 and ITU-T H.263.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

Video encoder 20 may implement any or all of the techniques of this disclosure for CABAC in a video coding process. Likewise, video decoder 30 may implement any or all of these techniques for CABAC in a video coding process. A video coder, as described in this disclosure, may refer to a video encoder or a video decoder. Similarly, a video coding unit may refer to a video encoder or a video decoder. Likewise, video coding may refer to video encoding or video decoding.

In one example of the disclosure, video encoder 20 may be configured to determine a first prediction type for a block of video data in a P slice, represent the first prediction type as a P-slice prediction type syntax element, determine a second prediction type for a block of video data in a B slice, represent the second prediction type as a B-slice prediction type syntax element, determine a P-slice binarization for the P-slice prediction type syntax element, determine a B-slice binarization for the B-slice prediction type syntax element, wherein the P-slice prediction type syntax element and the B-slice prediction type syntax element are determined using the same binarization logic, and encode the video data based on the binarizations of the P-slice prediction type syntax element and the B-slice prediction syntax element.

In another example of the disclosure, video decoder 30 may be configured to map a binarized P-slice prediction type syntax element to a prediction type using a binarization mapping for a block of video data in a P slice, map a binarized B-slice prediction type syntax element to a prediction type using the same binarization mapping for a block of video data in a B slice, and decode the video data based on the mapped prediction types.

In another example of the disclosure, video encoder 20 may be configured to determine a partition type for a prediction mode for a block of video data, encode a partition type bin of a prediction type syntax element for the block of video data using CABAC with a single context, wherein the single context is the same for any partition type, and encode a partition size bin of the prediction type syntax element for the block of video data using CABAC in bypass mode.

In another example of the disclosure, video decoder 30 may be configured to receive a prediction type syntax element for a block of video data that has been coded using CABAC, the prediction type syntax element including a partition type bin representing a partition type and a partition size bin representing a partition size, decoding the partition type bin of the prediction type syntax element using CABAC with a single context, wherein the single context is the same for any partition type, and decoding the partition size bin of the prediction type syntax element using CABAC in bypass mode.

In another example of the disclosure, both video encoder 20 and video decoder 30 may be configured to code a Cb chroma coded block flag for a block of video data using CABAC, wherein coding the Cb chroma coded block flag comprises using a context set including one or more contexts as part of the CABAC, and code a Cr chroma coded block flag using CABAC, wherein coding the Cr chroma coded block flag comprises using the same context set as the Cb chroma coded block flag as part of the CABAC.

The JCT-VC is working on development of the HEVC standard. The HEVC standardization efforts are based on an evolving model of a video coding device referred to as the HEVC Test Model (HM). The HM presumes several additional capabilities of video coding devices relative to existing devices according to, e.g., ITU-T H.264/AVC. For example, whereas H.264 provides nine intra-prediction encoding modes, the HM may provide as many as thirty-three intra-prediction encoding modes. The following section will discuss certain aspects of the HM in more detail.

In general, the working model of the HM describes that a video frame or picture may be divided into a sequence of treeblocks or largest coding units (LCU) that include both luma and chroma samples. A treeblock has a similar purpose as a macroblock of the H.264 standard. A slice includes a number of consecutive treeblocks in coding order. A video frame or picture may be partitioned into one or more slices. Each treeblock may be split into coding units (CUs) according to a quadtree. For example, a treeblock, as a root node of the quadtree, may be split into four child nodes, and each child node may in turn be a parent node and be split into another four child nodes. A final, unsplit child node, as a leaf node of the quadtree, comprises a coding node, i.e., a coded video block. Syntax data associated with a coded bitstream may define a maximum number of times a treeblock may be split, and may also define a minimum size of the coding nodes.

A CU includes a coding node and prediction units (PUs) and transform units (TUs) associated with the coding node. A size of the CU generally corresponds to a size of the coding node and must typically be square in shape. The size of the CU may range from 8×8 pixels up to the size of the treeblock with a maximum of 64×64 pixels or greater. Each CU may contain one or more PUs and one or more TUs. Syntax data associated with a CU may describe, for example, partitioning of the CU into one or more PUs. Partitioning modes may differ between whether the CU is skip or direct mode encoded, intra-prediction mode encoded, or inter-prediction mode encoded. PUs may be partitioned to be non-square in shape. Syntax data associated with a CU may also describe, for example, partitioning of the CU into one or more TUs according to a quadtree. A TU can be square or non-square in shape.

The emerging HEVC standard allows for transformations according to TUs, which may be different for different CUs. The TUs are typically sized based on the size of PUs within a given CU defined for a partitioned LCU, although this may not always be the case. The TUs are typically the same size or smaller than the PUs. In some examples, residual samples corresponding to a CU may be subdivided into smaller units using a quadtree structure known as "residual quad tree" (RQT). The leaf nodes of the RQT may be referred to as transform units (TUs). Pixel difference values associated with the TUs may be transformed to produce transform coefficients, which may be quantized.

In general, a PU refers to data related to the prediction process. For example, when the PU is intra-mode encoded, the PU may include data describing an intra-prediction mode for the PU. As another example, when the PU is inter-mode encoded, the PU may include data defining a motion vector for the PU. The data defining the motion vector for a PU may describe, for example, a horizontal component of the motion vector, a vertical component of the motion vector, a resolution for the motion vector (e.g., one-quarter pixel precision or one-eighth pixel precision), a reference picture to which the motion vector points, and/or a reference picture list (e.g., List 0, List 1, or List C) for the motion vector.

In general, a TU is used for the transform and quantization processes. A given CU having one or more PUs may also include one or more transform units (TUs). Following prediction, video encoder 20 may calculate residual values from the video block identified by the coding node in accordance with the PU. The coding node is then updated to reference the residual values rather than the original video block. The residual values comprise pixel difference values that may be transformed into transform coefficients, quantized, and scanned using the transforms and other transform information specified in the TUs to produce serialized transform coefficients for entropy coding. The coding node may once again be updated to refer to these serialized transform coefficients. This disclosure typically uses the term "video block" to refer to a coding node of a CU. In some specific cases, this disclosure may also use the term "video block" to refer to a treeblock, i.e., LCU, or a CU, which includes a coding node and PUs and TUs.

A video sequence typically includes a series of video frames or pictures. A group of pictures (GOP) generally comprises a series of one or more of the video pictures. A GOP may include syntax data in a header of the GOP, a header of one or more of the pictures, or elsewhere, that describes a number of pictures included in the GOP. Each slice of a picture may include slice syntax data that describes an encoding mode for the respective slice. Video encoder 20 typically operates on video blocks within individual video slices in order to encode the video data. A video block may correspond to a coding node within a CU. The video blocks may have fixed or varying sizes, and may differ in size according to a specified coding standard.

As an example, the HM supports prediction in various PU sizes. Assuming that the size of a particular CU is 2N×2N, the HM supports intra-prediction in PU sizes of 2N×2N or N×N, and inter-prediction in symmetric PU sizes of 2N×2N, 2N×N, N×2N, or N×N. The HM also supports asymmetric partitioning for inter-prediction in PU sizes of 2N×nU, 2N×nD, nL×2N, and nR×2N. In asymmetric partitioning, one direction of a CU is not partitioned, while the other direction is partitioned into 25% and 75%. The portion of the CU corresponding to the 25% partition is indicated by an "n" followed by an indication of "Up", "Down," "Left," or "Right." Thus, for example, "2N×nU" refers to a 2N×2N CU that is partitioned horizontally with a 2N×0.5N PU on top and a 2N×1.5N PU on bottom.

Figure 4:
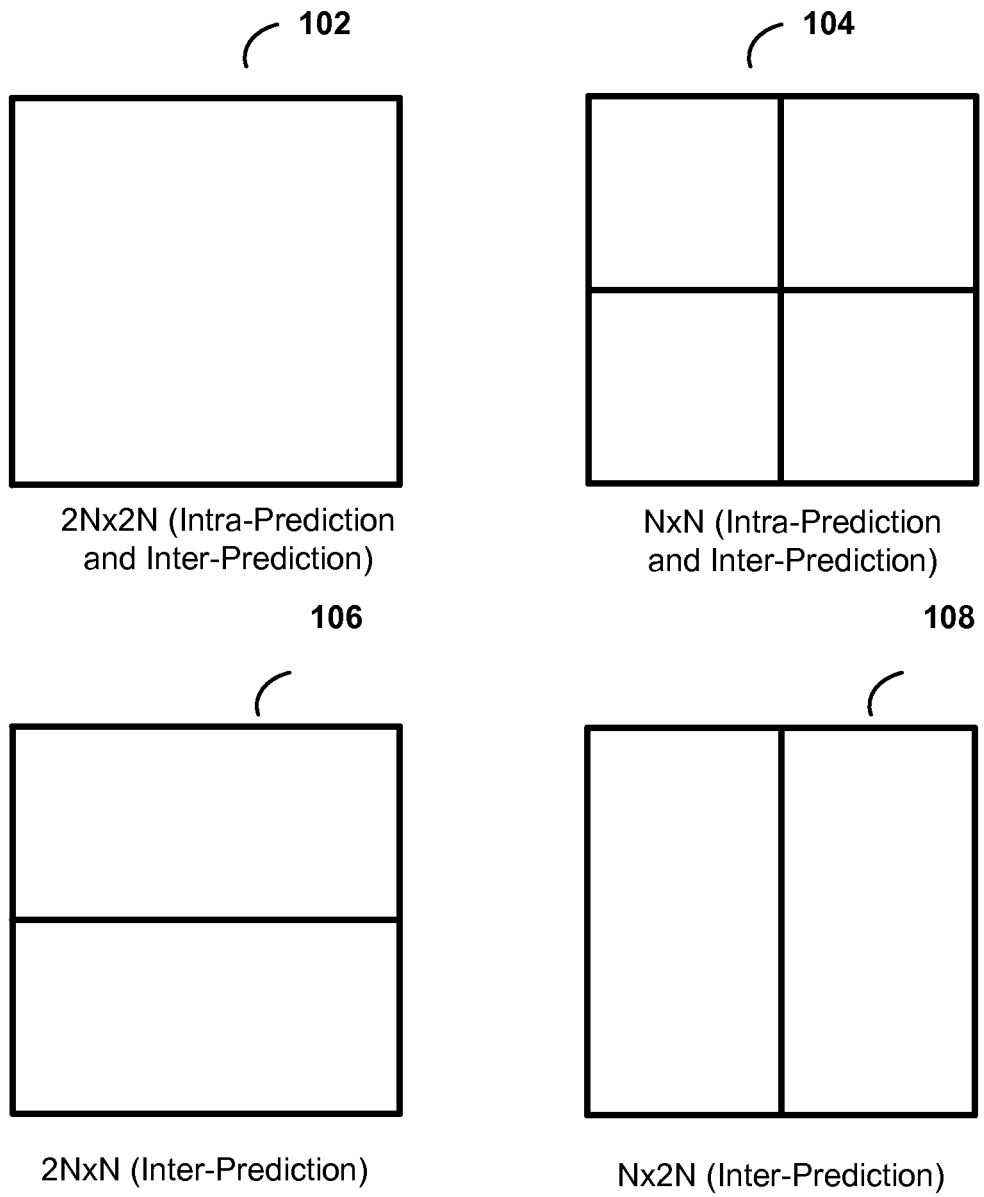
FIG. 4 is a conceptual drawing showing both square and non-square partition types.

FIG. 4 is a conceptual drawing showing both square and non-square partition types for intra-prediction and inter-prediction. Partition 102 is a 2N×2N partition and may be used for both intra-prediction and inter-prediction. Partition 104 is an N×N partition and may be used for both intra-prediction and inter-prediction. Partition 106 is a 2N×N partition and is currently used in HEVC for inter-prediction. Partition 108 is an N×2N partition and is currently used in HEVC for inter-prediction.

Figure 5:
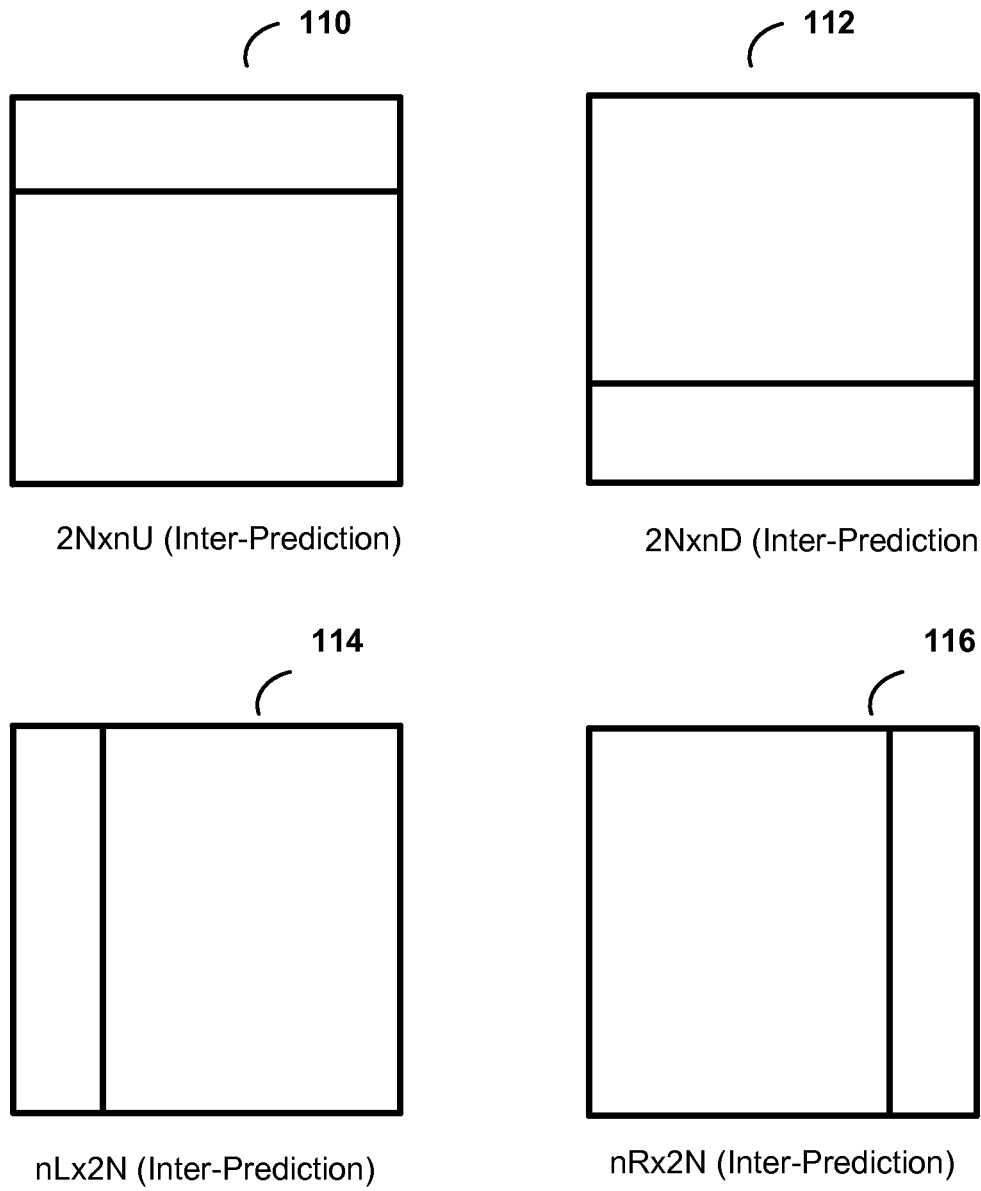
FIG. 5 a conceptual drawing showing asymmetric partition types.

FIG. 5 a conceptual drawing showing asymmetric partition types. Partition 110 is a 2N×nU partition and is currently used in HEVC for inter-prediction. Partition 112 is a 2N×nD partition and is currently used in HEVC for inter-prediction. Partition 114 is an nL×2N partition and is currently used in HEVC for inter-prediction. Partition 116 is an nR×2N partition and is currently used in HEVC for inter-prediction.

In this disclosure, "N×N" and "N by N" may be used interchangeably to refer to the pixel dimensions of a video block in terms of vertical and horizontal dimensions, e.g., 16×16 pixels or 16 by 16 pixels. In general, a 16×16 block will have 16 pixels in a vertical direction (y=16) and 16 pixels in a horizontal direction (x=16). Likewise, an N×N block generally has N pixels in a vertical direction and N pixels in a horizontal direction, where N represents a nonnegative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N.

Following intra-predictive or inter-predictive coding using the PUs of a CU, video encoder 20 may calculate residual data to which the transforms specified by TUs of the CU are applied. The residual data may correspond to pixel differences between pixels of the unencoded picture and prediction values corresponding to the CUs. Video encoder 20 may form the residual data for the CU, and then transform the residual data to produce transform coefficients.

Following any transforms to produce transform coefficients, video encoder 20 may perform quantization of the transform coefficients. Quantization generally refers to a process in which transform coefficients are quantized to possibly reduce the amount of data used to represent the coefficients, providing further compression. The quantization process may reduce the bit depth associated with some or all of the coefficients. For example, an n-bit value may be rounded down to an m-bit value during quantization, where n is greater than m.

In some examples, video encoder 20 may utilize a predefined scan order to scan the quantized transform coefficients to produce a serialized vector that can be entropy encoded. In other examples, video encoder 20 may perform an adaptive scan. After scanning the quantized transform coefficients to form a one-dimensional vector, video encoder 20 may entropy encode the one-dimensional vector, e.g., according to context adaptive variable length coding (CAVLC), context adaptive binary arithmetic coding (CABAC), syntax-based context-adaptive binary arithmetic coding (SBAC), Probability Interval Partitioning Entropy (PIPE) coding or another entropy encoding methodology. Video encoder 20 may also entropy encode syntax elements associated with the encoded video data for use by video decoder 30 in decoding the video data.

To perform CABAC, video encoder 20 may assign a context within a context model to a symbol to be transmitted. The context may relate to, for example, whether neighboring values of the symbol are non-zero or not. To perform CAVLC, video encoder 20 may select a variable length code for a symbol to be transmitted. Codewords in VLC may be constructed such that relatively shorter codes correspond to more probable symbols, while longer codes correspond to less probable symbols. In this way, the use of VLC may achieve a bit savings over, for example, using equal-length codewords for each symbol to be transmitted. The probability determination may be based on a context assigned to the symbol.

This disclosure is related techniques for context adaptive binary arithmetic coding (CABAC) entropy coders or other entropy coders, such as probability interval partitioning entropy coding (PIPE) or related coders. Arithmetic coding is a form of entropy coding used in many compression algorithms that have high coding efficiency, because it is capable of mapping symbols to non-integer length codewords. An example of an arithmetic coding algorithm is Context Based Binary Arithmetic Coding (CABAC) used in H.264/AVC.

In general, coding data symbols using CABAC involves one or more of the following steps:

(1) Binarization: If a symbol to be coded is non-binary valued, it is mapped to a sequence of so-called "bins." Each bin can have a value of "0" or "1."

(2) Context Assignment: Each bin (in regular mode) is assigned to a context. A context model determines how a context for a given bin is calculated based on information available for the bin, such as values of previously encoded symbols or bin number.

(3) Bin encoding: Bins are encoded with an arithmetic encoder. To encode a bin, the arithmetic encoder requires as an input a probability of the bin's value, i.e., a probability that the bin's value is equal to "0," and a probability that the bin's value is equal to "1." The (estimated) probability of each context is represented by an integer value called a "context state." Each context has a state, and thus the state (i.e., estimated probability) is the same for bins assigned to one context, and differs between contexts.

(4) State update: The probability (state) for a selected context is updated based on the actual coded value of the bin (e.g., if the bin value was "1," the probability of "1's" is increased).

It should be noted that probability interval partitioning entropy coding (PIPE) uses principles similar to those of arithmetic coding, and can thus also utilize the techniques of this disclosure.

CABAC in H.264/AVC and HEVC uses states, and each state is implicitly related to a probability. There are variants of CABAC, in which a probability of a symbol ("0" or "1") is used directly, i.e., the probability (or an integer version of it) is the state. For example, such variants of CABAC are described in "Description of video coding technology proposal by France Telecom, NTT, NTT DOCOMO, Panasonic and Technicolor," JCTVC-A114, 1$^{st}$ JCT-VC Meeting, Dresden, Del., April 2010, referred to as "JCTVC-A114" hereinafter, and A. Alshin and E. Alshina, "Multi-parameter probability update for CABAC," JCTVC-F254, 6$^{th}$ JCT-VC Meeting, Torino, IT, July 2011, referred to as "JCTVC-F254" hereinafter.

In this disclosure, a reduction in the number of binarizations and/or contexts used in CABAC is proposed. In particular, this disclosure proposes techniques that may lower the number contexts used in CABAC by up to 56. With 56 less contexts, experimental results show 0.00%, 0.01% and −0.13% bit-distortion (BD) rate changes in high efficiency intra-only, random access and low-delay test conditions, respectively. As such, a reduction in the number of contexts needed reduces storage needs at both the encoder and the decoder without materially affecting coding efficiency.

In this disclosure, a reduction in the number of CABAC contexts used for the syntax elements, pred_type, merge_idx, inter_pred_flag, ref_idx_lx, cbf_cb, cbf_cr, coeff_abs_level_greater1_flag, and coeff_abs_level_greater2_fag, is proposed. The modifications reduce up to 56 contexts with negligible coding efficiency changes. The proposed context reductions for the syntax elements above may be used alone or in any combination.

The syntax element pred_type includes a prediction mode (pred_mode_flag) and a partition type (part_mode) for each coding unit. The syntax element pred_mode_flag equal to 0 specifies that the current coding unit is coded in inter-prediction mode. The syntax element pred_mode_flag equal to 1 specifies that the current coding unit is coded in intra-prediction mode. The syntax element part_mode specifies partitioning mode of the current coding unit.

The syntax element merge_idx [x0] [y0] specifies the merging candidate index of the merging candidate list where x0, y0 specify the location (x0, y0) of the top-left luma sample of the considered prediction block relative to the top-left luma sample of the picture. When merge_idx[x0][y0] is not present, it is inferred to be equal to 0. A merge candidate list is a list of adjacent coding units to a current units from which motion information may be copied.

The syntax element inter_pred_flag[x0][y0] specifies whether uni-prediction, or bi-prediction is used for the current prediction unit. The array indices x0, y0 specify the location (x0, y0) of the top-left luma sample of the considered prediction block relative to the top-left luma sample of the picture.

The syntax element ref_idx_lx refers to specific reference picture within a reference picture list.

The syntax elements cbf_cb, cbf_cr indicate whether or not chroma (Cb and Cr, respectively) transform blocks contain non-zero transform coefficients. The syntax element cbf_cb [x0][y0][trafoDepth] equal to 1 specifies that the Cb transform block contains one or more transform coefficient levels not equal to 0. The array indices x0, y0 specify the location (x0, y0) of the top-left luma sample of the considered transform block relative to the top-left luma sample of the picture. The array index trafoDepth specifies the current subdivision level of a coding unit into blocks for the purpose of transform coding. The array index trafoDepth is equal to 0 for blocks that correspond to coding units. When cbf_cb[x0][y0][trafoDepth] is not present and the prediction mode is not intra-prediction, the value of cbf_cb[x0][y0][trafoDepth] is inferred to be equal to 0.

The syntax element cbf_cr[x0][y0][trafoDepth] equal to 1 specifies that the Cr transform block contains one or more transform coefficient levels not equal to 0. The array indices x0, y0 specify the location (x0, y0) of the top-left luma sample of the considered transform block relative to the top-left luma sample of the picture. The array index trafoDepth specifies the current subdivision level of a coding unit into blocks for the purpose of transform coding. The array index trafoDepth is equal to 0 for blocks that correspond to coding units. When cbf_cr[x0][y0][trafoDepth] is not present and the prediction mode is not intra-prediction, the value of cbf_cr[x0][y0][trafoDepth] is inferred to be equal to 0.

The syntax element coeff_abs_level_greater1_flag[n] specifies for the scanning position n whether there are transform coefficient levels greater than 1. When coeff_abs_level_greater1_flag[n] is not present, it is inferred to be equal to 0.

The syntax element coeff_abs_level_greater2_flag[n] specifies for the scanning position n whether there are transform coefficient levels greater than 2. When coeff_abs_level_greater2_flag[n] is not present, it is inferred to be equal to 0.

In one proposal for HEVC, different binarizations on syntax element pred_type are used in P and B slices as shown in Table 1. This disclosure proposes using the same binarizations for P and B slices. Examples are shown in Tables 2-4. Table 5 shows the coding performance impact on P slice under common test conditions (e.g., see F. Bossen, "Common test conditions and software reference configurations," JCTVC-F900).

TABLE 1

Binarization for pred_type in one proposal for HEVC

| Slice type | Value of pred_type | PredMode | PartMode | Bin string cLog2CUSize > Log2MinCUSize (1) | cLog2CUSize == Log2MinCUSize cLog2CUSize == 3 && !inter_4x4_enabled_flag (2) | cLog2CUSize > 3 \|\| inter_4x4_enabled_flag (3) |
|---|---|---|---|---|---|---|
| I | 0 | MODE_INTRA | PART_2Nx2N | — | 1 | 1 |
|   | 1 | MODE_INTRA | PART_NxN | — | 0 | 0 |
| P | 0 | MODE_INTER | PART_2Nx2N | 0 1 | 0 1 | 0 1 |
|   | 1 | MODE_INTER | PART_2NxN | 0 011 | 0 01 | 0 01 |
|   | 2 | MODE_INTER | PART_Nx2N | 0 0011 | 0 00 | 0 001 |
|   | 4 | MODE_INTER | PART_2NxnU | 0 0100 | — | — |
|   | 5 | MODE_INTER | PART_2NxnD | 0 0101 | — | — |
|   | 6 | MODE_INTER | PART_nLx2N | 0 00100 | — | — |
|   | 7 | MODE_INTER | PART_nRx2N | 0 00101 | — | — |
|   | 3 | MODE_INTER | PART_NxN | — | — | 0 000 |
|   | 4 | MODE_INTRA | PART_2Nx2N | 1 | 11 | 11 |
|   | 5 | MODE_INTRA | PART_NxN | — | 10 | 10 |
| B | 0 | MODE_INTER | PART_2Nx2N | 1 | 1 | 1 |
|   | 1 | MODE_INTER | PART_2NxN | 011 | 01 | 01 |
|   | 2 | MODE_INTER | PART_Nx2N | 0011 | 001 | 001 |
|   | 4 | MODE_INTER | PART_2NxnU | 0100 | — | — |
|   | 5 | MODE_INTER | PART_2NxnD | 0101 | — | — |
|   | 6 | MODE_INTER | PART_nLx2N | 00100 | — | — |

TABLE 1-continued

Binarization for pred_type in one proposal for HEVC

| | | | | Bin string | | |
|---|---|---|---|---|---|---|
| | | | | | cLog2CUSize = = Log2MinCUSize | |
| Slice type | Value of pred_type | PredMode | PartMode | cLog2CUSize > Log2MinCUSize (1) | cLog2CUSize = = 3 && !inter_4×4_enabled_flag (2) | cLog2CUSize > 3 \|\| inter_4×4_enabled_flag (3) |
| | 7 | MODE_INTER | PART_nR×2N | 00101 | — | — |
| | 3 | MODE_INTER | PART_N×N | — | — | 0001 |
| | 4 | MODE_INTRA | PART_2N×2N | 000 | 000 0 | 0000 0 |
| | 5 | MODE_INTRA | PART_N×N | — | 000 1 | 0000 1 |

As can be seen in Table 1, I slices (e.g., slices that only include intra-predicted blocks), include two different prediction types (pred_type). One bin string (binarization) is used for an intra-predicted block with a 2N×2N partition type, and another bin string is used for an intra-predicted block with an N×N partition type. As shown in Table 1, the bin string used for I slices are not dependent on CU size.

For P and B slices, in Table 1, different bin strings are used for each value of pred_type. Again, the value of pred_type depends on both the prediction mode (inter-prediction or intra-prediction) and the partition type used. For P and B slices, the actual bin string used further depends on the size of the CU being coded and whether or not inter-prediction is enabled for a 4×4 block size.

The first column under bin string applies for the situation where the logarithmic function of the CU size of the CU being coded is greater than the logarithmic function of the minimum allowable CU size. According to one example in HEVC, the first column of bin strings is used if c Log 2CUSize>Log 2MinCUsize. The logarithmic function is used to create a smaller number so that a smaller consecutive index may be used.

If the logarithmic function of the CU size of the CU being coded is equivalent to the logarithmic function the minimum allowable CU size (i.e., c Log 2CUSize==Log 2MinCUSize) then one of columns 2 and 3 under bin string in Table 1 is used to select the binarization. Column 2 is used when the logarithmic function of the CU size of the CU being coded is equivalent to 3 and inter-prediction for a 4×4 CU is not enabled (i.e., c Log 2CUSize==3 && !inter_4×4_enabled_flag). Column 3 is used when the logarithmic function of the CU size of the CU being coded is greater than 3 or when inter-prediction for a 4×4 CU is enabled (i.e., c Log 2CUSize>3||inter_4×4_enabled_flag).

Table 2 below shows example binarizations where P and B slices use the same bin strings, in accordance with one or more examples described in this disclosure. As shown in Table 2, P slices use the same binarizations used for B slices in Table 1. In this way, it is not necessary to store and use a separate set of contexts for both P and B slices. As such, the total number of contexts needed to code the pred_type syntax element is reduced. Furthermore, only one mapping (instead of two) between the bin string logic (shown in columns (1)-(3)) and the actual bin string need be stored.

TABLE 2

Binarization for pred_type in one example of the disclosure

| | | | | Bin string | | |
|---|---|---|---|---|---|---|
| | Value | | | | cLog2CUSize = = Log2MinCUSize | |
| Slice type | of pred_ type | PredMode | PartMode | cLog2CUSize > Log2MinCUSize (1) | cLog2CUSize = = 3 && !inter_4×4_enabled_flag (2) | cLog2CUSize > 3 \|\| inter_4×4_enabled_flag (3) |
| I | 0 | MODE_INTRA | PART_2N×2N | — | 1 | 1 |
| | 1 | MODE_INTRA | PART_N×N | — | 0 | 0 |
| P or B | 0 | MODE_INTER | PART_2N×2N | 1 | 1 | 1 |
| | 1 | MODE_INTER | PART_2N×N | 011 | 01 | 01 |
| | 2 | MODE_INTER | PART_N×2N | 0011 | 001 | 001 |
| | 4 | MODE_INTER | PART_2N×nU | 0100 | — | — |
| | 5 | MODE_INTER | PART_2N×nD | 0101 | — | — |
| | 6 | MODE_INTER | PART_nL×2N | 00100 | — | — |
| | 7 | MODE_INTER | PART_nR×2N | 00101 | — | — |
| | 3 | MODE_INTER | PART_N×N | — | — | 0001 |
| | 4 | MODE_INTRA | PART_2N×2N | 000 | 000 0 | 0000 0 |
| | 5 | MODE_INTRA | PART_N×N | — | 000 1 | 0000 1 |

Table 3 below shows another example of a binarization for pred_type. In this example, B slices use the same binarizations as P slices from Table 1. Table 4 below shows an additional example where P slices and B slices use the same binarizations. Tables 2-4 are only meant to show examples of shared binarizations between P and B slices. Any binarization or binarization rules may be used so that the pred_type syntax elements for both P and B slices share the same binarizations.

Video encoder 20 and video decoder 30 may store the same mapping rules and mapping tables (e.g., as shown in Tables 2-4) for use with both P and B slices. CABAC encoding and decoding may be applied to the pred_type syntax element using these mappings.

In this way, video encoder 20 may be configured to determine a first prediction type for a block of video data in a P slice, represent the first prediction type as a P-slice prediction type syntax element, determine a second prediction type for a block of video data in a B slice, represent the second prediction type as a B-slice prediction type syntax element, determine a P-slice binarization for the P-slice prediction type syntax element, determine a B-slice binarization for the B-slice prediction type syntax element, wherein the P-slice prediction type syntax element and the B-slice prediction type syntax element are determined using the same binarization logic, and encode the video data based on the binarizations of the P-slice prediction type syntax element and the B-slice prediction syntax element.

Video encoder 20 may be further configured to binarize the P-slice prediction type syntax element with the determined P-slice binarization, binarize the B-slice prediction type syntax element with the determined B-slice binarization, apply context adaptive binary arithmetic coding (CABAC) to the binarized P-slice prediction type syntax element, and apply context adaptive binary arithmetic coding (CABAC) to the binarized B-slice prediction type syntax element.

Similarly, video decoder 30 may be configured to map a binarized P-slice prediction type syntax element to a prediction type using a binarization mapping for a block of video data in a P slice, map a binarized B-slice prediction type syntax element to a prediction type using the same binarization mapping for a block of video data in a B slice, and decode the video data based on the mapped prediction types.

Video decoder 30 may be further configured to receive a context adaptive binary arithmetic coded P-slice prediction type syntax element which indicates the prediction type for the block of video data in a P slice, receive a context adaptive binary arithmetic coded B-slice prediction type syntax element which indicates the prediction type for the block of video data in a B slice, decode the P-slice prediction type syntax element to produce the binarized P-slice prediction type syntax element, and decode the B-slice prediction type syntax element to produce the binarized B-slice prediction type syntax element.

TABLE 3

Binarization for pred_type in another example of the disclosure

| | | | | Bin string | | |
|---|---|---|---|---|---|---|
| | | | | | cLog2CUSize == Log2MinCUSize | |
| Slice type | Value of pred_type | PredMode | PartMode | cLog2CUSize > Log2MinCUSize (1) | cLog2CUSize == 3 && !inter_4x4_enabled_flag (2) | cLog2CUSize > 3 \|\| inter_4x4_enabled_flag (3) |
| I | 0 | MODE_INTRA | PART_2Nx2N | — | 1 | 1 |
| | 1 | MODE_INTRA | PART_NxN | — | 0 | 0 |
| P or B | 0 | MODE_INTER | PART_2Nx2N | 0 1 | 0 1 | 0 1 |
| | 1 | MODE_INTER | PART_2NxN | 0 011 | 0 01 | 0 01 |
| | 2 | MODE_INTER | PART_Nx2N | 0 0011 | 0 00 | 0 001 |
| | 4 | MODE_INTER | PART_2NxnU | 0 0100 | — | — |
| | 5 | MODE_INTER | PART_2NxnD | 0 0101 | — | — |
| | 6 | MODE_INTER | PART_nLx2N | 0 00100 | — | — |
| | 7 | MODE_INTER | PART_nRx2N | 0 00101 | — | — |
| | 3 | MODE_INTER | PART_NxN | — | — | 0 000 |
| | 4 | MODE_INTRA | PART_2Nx2N | 1 | 11 | 11 |
| | 5 | MODE_INTRA | PART_NxN | — | 10 | 10 |

TABLE 4

Binarization for pred_type in another example of the disclosure

| | | | | Bin string | | |
|---|---|---|---|---|---|---|
| | | | | | cLog2CUSize == Log2MinCUSize | |
| Slice type | Value of pred_type | PredMode | PartMode | cLog2CUSize > Log2MinCUSize (1) | cLog2CUSize == 3 && !inter_4x4_enabled_flag (2) | cLog2CUSize > 3 \|\| inter_4x4_enabled_flag (3) |
| I | 0 | MODE_INTRA | PART_2Nx2N | — | 1 | 1 |
| | 1 | MODE_INTRA | PART_NxN | — | 0 | 0 |
| P or B | 0 | MODE_INTER | PART_2Nx2N | 1 | 1 | 1 |
| | 1 | MODE_INTER | PART_2NxN | 011 | 01 | 01 |
| | 2 | MODE_INTER | PART_Nx2N | 001 | 00 | 001 |
| | 4 | MODE_INTER | PART_2NxnU | 0100 | — | — |
| | 5 | MODE_INTER | PART_2NxnD | 0101 | — | — |
| | 6 | MODE_INTER | PART_nLx2N | 0000 | — | — |
| | 7 | MODE_INTER | PART_nRx2N | 0001 | — | — |
| | 3 | MODE_INTER | PART_NxN | — | — | 000 |
| | 4 | MODE_INTRA | PART_2Nx2N | 000 | 000 0 | 0000 0 |
| | 5 | MODE_INTRA | PART_NxN | — | 000 1 | 0000 1 |

Table 5 below shows the coding performance using the shared binarization for P and B slices shown in Table 2. As can be seen in Table 5, little to no coding efficiency is lost using the shared binarizations. Low delay P HE (High Efficiency) is a common test condition for uni-directionally predicted (P) slice binarizations. Classes A-E represent different frame resolutions. Class A is a 2 k×4 k resolution. Class B is a 1920×1080 resolution. Class C is a WVGA resolution. Class D is a WQVGA resolution. Class E is a 720P resolution. A 0.1 to 0.2 percent change in Low delay P HE test condition is generally considered to be insignificant.

TABLE 5

Coding performance for unified binarization on pred_type

| BD-rate | Low delay P HE | | |
|---|---|---|---|
| | Y | U | V |
| Class A | | | |
| Class B | 0.02% | 0.16% | 0.26% |
| Class C | 0.01% | 0.05% | −0.12% |
| Class D | −0.02% | −0.10% | −0.12% |
| Class E | 0.02% | 0.03% | 0.05% |
| All | 0.01% | 0.04% | 0.03% |
| Enc T[%] | | | |
| Dec T[%] | | | |

Optionally, the same binarizations (not limited to Tables 2-4) for prediction type (includes prediction size and/or prediction mode) can be shared in two and more different types of inter prediction slices. The inter prediction slices may include, but are not limited to:

a. P slice: slice only supports uni-directional motion prediction b. B slice: slice supports uni-directional and bi-direction motion prediction c. In scalable video coding: enhancement layer can share the same binarizations with the base layer.

d. In multiview coding: different views may share the same binarizations.

When asymmetric partitioning is enabled, four contexts, equally divided into two context sets, are used for CABAC on the last two bins for signaling the pred_type syntax element for asymmetric partitions (i.e., PART_2N×nU, PART_2N× nD, PART_nL×2N, PART_nR×2N). Depending on whether the partition is divided along the horizontal direction or the vertical direction, one context set is applied. The second to last bin (i.e., the partition type bin; part_mode) specifies whether the current CU has symmetric partitions or asymmetric partitions. The last bin (i.e., the partition size bin; part_mode) specifies whether the size of the first partition is one-fourth or three-fourth of the CU size. Table 6 shows an example of contexts the second to last (partition type) and last (partition size) for the pred_type syntax element.

TABLE 6

Contexts for Last Two Bins of the Pred_Type Syntax Element

| Bin | Context |
|---|---|
| Partition Type (Symmetric or Asymmetric) | Context Set 1 (2 Contexts, one for vertical partitioning, 1 for horizontal partitioning) |
| Partition Size (First partition is ¼ CU or ¾ CU) | Context Set 2 (2 Contexts, one for ¼ CU and one for ¾ CU) |

This disclosure proposes to use one context for the second to last bin (i.e., the partition type bin) and to use bypass mode on the last bin (i.e., the partition size bin). As a result, the number of contexts is reduced from 4 to 1. Table 7 shows an example of context used according to this example of the disclosure. Table 8 shows the coding performance associated with the proposed modifications. Random access high efficiency (HE) is a test condition with random access frames. Low delay B HE is a test condition that allows bi-direction prediction.

TABLE 7

Contexts for Last Two Bins of the Pred_Type Syntax Element According to an Example of this Disclosure.

| Bin | Context |
|---|---|
| Partition Type (Symmetric or Asymmetric) | Context Set 1 (1 Contexts) |
| Partition Size (First partition is ¼ CU or ¾ CU) | Bypass Mode (No Contexts) |

TABLE 8

Coding performance of the proposed method for pred_type

| | All Intra HE | | | Random access HE | | | Low delay B HE | | |
|---|---|---|---|---|---|---|---|---|---|
| BD-rate | Y | U | V | Y | U | V | Y | U | V |
| Class A | | | | 0.03% | −0.17% | −0.29% | | | |
| Class B | | | | 0.02% | −0.03% | 0.04% | 0.01% | 0.00% | −0.24% |
| Class C | | | | −0.01% | −0.03% | −0.02% | −0.01% | −0.03% | 0.02% |
| Class D | | | | 0.01% | 0.07% | −0.05% | 0.01% | 0.06% | 0.03% |
| Class E | | | | | | | 0.00% | 0.30% | 0.39% |
| All | | | | 0.01% | −0.04% | −0.07% | 0.00% | 0.06% | 0.01% |
| Enc T[%] | | | | | | | | | |
| Dec T[%] | | | | | | | | | |

In this way, according to this example, video encoder 20 may be configured to determine a partition type for a prediction mode for a block of video data, encode a partition type bin of a prediction type syntax element for the block of video data using context adaptive binary arithmetic coding with a single context, wherein the single context is the same for any partition type, and encode a partition size bin of a prediction type syntax for the block of video data using context adaptive binary arithmetic coding in bypass mode.

Similarly, according this example, video decoder 30 may be configured to receive a prediction type syntax element for a block of video data that has been coded using context adaptive binary arithmetic coding (CABAC), the prediction type syntax element including a partition type bin representing a partition type and a partition size bin representing a partition size, decoding the partition type bin of the prediction type syntax element using context adaptive binary arithmetic coding with a single context, wherein the single context is the same for any partition type, and decoding the partition size bin of the prediction type syntax for a block of video data using context adaptive binary arithmetic coding in bypass mode.

In another example, when coding a rectangle partition type, bypass mode or a single context can be used for the bin which indicates whether the partition mode is PART_nL×2N or PART_nR×2N, or whether the mode is PART_2N×nU, PART_2N×nD. Using bypass mode or a single context is applicable because the chance of either partition mode being used is close to 50%. Also optionally, bypass mode or a single context may be used for the bin which indicates whether the mode is a symmetric partition or an asymmetric partition.

The next example of the disclosure relates to signaling in a "merge" mode of inter-prediction. In merge mode, the encoder instructs a decoder, through bitstream signaling of prediction syntax, to copy a motion vector, reference index (identifying a reference picture, in a given reference picture list, to which the motion vector points) and the motion prediction direction (which identifies the reference picture list (List 0 or List 1), i.e., in terms of whether the reference frame temporally precedes or follows the currently frame) from a selected candidate motion vector for a current portion of the picture that is to be coded. This is accomplished by signaling in the bitstream an index into a candidate motion vector list identifying the selected candidate motion vector (i.e., the particular spatial motion vector predictor (MVP) candidate or temporal MVP candidate).

Thus, for merge mode, the prediction syntax may include a flag identifying the mode (in this case "merge" mode) and an index (merge_idx) identifying the selected candidate motion vector. In some instances, the candidate motion vector will be in a causal portion in reference to the current portion. That is, the candidate motion vector will have already been decoded by the decoder. As such, the decoder has already received and/or determined the motion vector, reference index, and motion prediction direction for the causal portion. As such, the decoder may simply retrieve the motion vector, reference index, and motion prediction direction associated with the causal portion from memory and copy these values as the motion information for the current portion. To reconstruct a block in merge mode, the decoder obtains the predictive block using the derived motion information for the current portion, and adds the residual data to the predictive block to reconstruct the coded block.

In HM4.0, one of the five merge candidates are signalled when the current PU is in merge mode. A truncated unary code is utilized to represent the syntax element merge_idx. In one proposal for HEVC, for CABAC, each bin uses one context. This disclosure proposes using one context repeatedly in all four bins, as shown in Table 9.

TABLE 9

Contexts for Last Two Bins of the Pred_Type Syntax Element

| Bin | Context |
| --- | --- |
| Bin 0-3 for merge_idx | Context Set 1 (same context set for all bins) |

Table 10 shows the coding performance associated with this example.

TABLE 10

Coding performance of the proposed method on merge_idx

| | All Intra HE | | | Random access HE | | | Low delay B HE | | |
| --- | --- | --- | --- | --- | --- | --- | --- | --- | --- |
| BD-rate | Y | U | V | Y | U | V | Y | U | V |
| Class A | | | | 0.00% | −0.20% | −0.07% | | | |
| Class B | | | | 0.01% | 0.03% | 0.03% | 0.01% | −0.08% | −0.22% |
| Class C | | | | 0.00% | 0.04% | 0.00% | 0.00% | −0.08% | −0.09% |
| Class D | | | | 0.03% | −0.09% | −0.05% | 0.05% | −0.24% | 0.44% |
| Class E | | | | | | | −0.14% | 0.08% | 0.78% |
| All | | | | 0.01% | −0.05% | −0.02% | −0.01% | −0.09% | 0.17% |
| Enc T[%] | | | | | | | | | |
| Dec T[%] | | | | | | | | | |

Optionally, more than one context may be used in merge index coding, with some bins sharing the same context and some bins using other contexts. As one example, only the consecutive bins share the same context. For example, bin2 and bin3 can share one context; bin2 and bin4 cannot share the same context unless bin3 is also sharing the context.

As another example, assume the total number of bins of the merge index is N (first bin is bin0, the last bin is bin N−1). Y thresholds, $thres_i$, i=1, . . . , y, are used to determine the context sharing in merge index coding. In this example, the following rules indicate how contexts are shared between bins:

1. 0<Y<N (there are fewer thresholds than bins)
2. $thres_i$<$thres_{i+1}$
3. 0<$thres_1$
4. $thres_y$=N
5. $bin_j$ will share one context where i={$thres_y$, . . . , $thres_{i+1}$−1}

Based on these rules, the previous method in which one context is repeatedly used in all four bins, can be viewed as one case where N=4, Y=1, $thres_1$=4. Therefore, bin 0 to bin 3 are sharing the same context.

Another example includes setting N=4, Y=2, $thres_1$=2, $thres_2$=4. In this example, bin1 and bin1 share the same contexts and bin2 and bin3 share the same contexts.

The inter-prediction flag (inter_pred_flag) specifies whether uni-prediction, or bi-prediction is used for the current PU. In some examples, the context index for the inter-prediction flag is equal to the current CU depth. As there are four possible CU depths (0-3), there are four possible contexts for coding the inter_pred_flag.

This disclosure proposes that the context index used to select a context for coding the inter_pred_flag is equal to the current CU depth (e.g., the level quadtree decomposition for CUs), but is capped at a chosen threshold (i.e., is the lesser of the current CU depth or a threshold). The threshold may be chosen to be 2 in one example. Alternatively, the context index may be equal to the maximum CU depth minus the current CU depth and capped at a chosen threshold. Alternatively, a predefined mapping table can be design to select context index by a given CU depth. The mapping table can be implemented as a set of logic. As a result, 3 contexts are used to code the syntax element inter_pred_flag.

Table 11 shows the coding performance when the initialization table is changed, but the number of contexts is not changed. Table 12 shows the coding performance of the proposed technique which reduces the number of contexts from 4 to 3.

The reference frame index (ref_idx_lx) is signalled by using a truncated unary code with respect to the active reference frame in the associated list (e.g., List 0 or List 1). Three contexts are used to code the reference frame index. One context for bin 0, one context for bin 1, and one context is used on the rest of the bins. Table 13 shows an example of context assignments for the bins of the unary code for ref_idx_lx.

TABLE 13

| Context assignment for bins of ref_idx_lx | |
| --- | --- |
| Bins of ref_idx_lx unary code | Context |
| Bin 0 | Context 1 |
| Bin 1 | Context 2 |
| Bins 2-N (N is total number of bins) | Context 3 |

This disclosure proposes using two contexts to code the unary code for ref_idx_lx; one context on bin 0 and another context on the rest of the bins. Table 14 shows an example of context assignment for the bins of the unary code for

TABLE 11

Coding performance of HM4.0 with modified CABAC initialization on inter_pred_flag.

| | All Intra HE | | | Random access HE | | | Low delay B HE | | |
| --- | --- | --- | --- | --- | --- | --- | --- | --- | --- |
| BD-rate | Y | U | V | Y | U | V | Y | U | V |
| Class A | | | | 0.03% | −0.15% | −0.11% | | | |
| Class B | | | | −0.03% | 0.01% | −0.03% | 0.03% | −0.02% | −0.11% |
| Class C | | | | 0.00% | −0.12% | 0.06% | −0.03% | −0.16% | 0.01% |
| Class D | | | | −0.01% | −0.04% | 0.01% | −0.09% | 0.51% | 0.20% |
| Class E | | | | | | | 0.10% | −0.03% | 0.65% |
| All | | | | −0.01% | −0.07% | −0.02% | 0.00% | 0.07% | 0.14% |
| Enc T[%] | | | | | | | | | |
| Dec T[%] | | | | | | | | | |

TABLE 12

Coding performance of the proposed context reduction technique on inter_pred_flag.

| | All Intra HE | | | Random access HE | | | Low delay B HE | | |
| --- | --- | --- | --- | --- | --- | --- | --- | --- | --- |
| BD-rate | Y | U | V | Y | U | V | Y | U | V |
| Class A | | | | 0.05% | −0.11% | −0.14% | | | |
| Class B | | | | −0.01% | −0.03% | 0.02% | 0.00% | −0.01% | −0.15% |
| Class C | | | | −0.02% | −0.14% | −0.02% | 0.01% | 0.01% | −0.03% |
| Class D | | | | 0.03% | −0.01% | −0.01% | −0.09% | −0.12% | −0.01% |
| Class E | | | | | | | −0.12% | 0.08% | 0.45% |
| All | | | | 0.01% | −0.07% | −0.03% | −0.04% | −0.01% | 0.03% |
| Enc T[%] | | | | | | | | | |
| Dec T[%] | | | | | | | | | | ref_idx_lx according this example of the disclosure. Table 15 shows the coding performance associated to the proposed modifications.

TABLE 14

Context assignment for bins of ref_idx_lx

| Bins of ref_idx_lx unary code | Context |
|---|---|
| Bin 0 | Context 1 |
| Bins 1-N (N is total number of bins) | Context 2 |

TABLE 15

Coding performance of the proposed method on ref_idx_lx.

| | All Intra HE | | | Random access HE | | | Low delay B HE | | |
|---|---|---|---|---|---|---|---|---|---|
| BD-rate | Y | U | V | Y | U | V | Y | U | V |
| Class A | | | | −0.01% | −0.11% | −0.16% | | | |
| Class B | | | | −0.01% | 0.00% | −0.01% | 0.01% | −0.12% | 0.01% |
| Class C | | | | −0.01% | 0.02% | 0.03% | −0.04% | −0.14% | −0.07% |
| Class D | | | | 0.03% | 0.06% | 0.11% | −0.06% | 0.19% | −0.09% |
| Class E | | | | | | | −0.06% | −0.34% | 0.48% |
| All | | | | 0.00% | −0.01% | −0.01% | −0.03% | −0.09% | 0.05% |
| Enc T[%] | | | | | | | | | |
| Dec T[%] | | | | | | | | | |

For the chroma coded block flag syntax elements (cbf_cb and cbf_cr), two different context sets (5 contexts in each context set) are used for CABAC. The index of the actual context used in each set is equal to the current transform depth associated with chroma coded block flag. being coded. Table 16 shows the context sets for the cbf_cb and cbf_cr chroma coded block flags.

TABLE 16

Context Sets for cbf_cb and cbf_cr

| Chroma Coded Block Flag | Context Set |
|---|---|
| Cbf_cb | Context Set 1 (5 contexts) |
| Cbf_cr | Context Set 2 (5 contexts) |

This disclosure proposes that cbf_cb and cbf_cr share one context set. The index of the actual context used in each set may still be equal to the current transform depth associated with the chroma coded block flag being coded. Table 17 shows the context sets for the cbf_cb and cbf_cr chroma coded block flags according to examples of this disclosure. Table 18 shows the coding performance associate to the proposed modifications.

TABLE 17

Context Sets for cbf_cb and cbf_cr according to examples of this disclosure

| Chroma Coded Block Flag | Context Set |
|---|---|
| Cbf_cb | Context Set 1 (5 contexts) |
| Cbf_cr | Context Set 1 (5 contexts) |

TABLE 18

Coding performance of the proposed method on cbf_cb and cbf_cr.

| | All Intra HE | | | Random access HE | | | Low delay B HE | | |
|---|---|---|---|---|---|---|---|---|---|
| BD-rate | Y | U | V | Y | U | V | Y | U | V |
| Class A | −0.01% | 0.59% | −1.06% | 0.02% | 0.56% | −1.71% | | | |
| Class B | 0.00% | 0.59% | −1.07% | −0.01% | 0.68% | −1.32% | 0.01% | 1.06% | −1.89% |
| Class C | −0.01% | 0.17% | −0.75% | 0.00% | 0.09% | −0.63% | −0.01% | 0.21% | −0.97% |
| Class D | 0.00% | −0.17% | −0.51% | 0.04% | −0.23% | −0.80% | 0.04% | −0.36% | −0.45% |
| Class E | 0.00% | −0.36% | 0.24% | | | | 0.04% | 0.36% | 0.40% |
| All | 0.00% | 0.21% | −0.70% | 0.01% | 0.30% | −1.13% | 0.02% | 0.36% | −0.87% |
| Enc T[%] | | | | | | | | | |
| Dec T[%] | | | | | | | | | |

In this way, according to this example, both video encoder 20 and video decoder 30 may be configured to code a Cb chroma coded block flag for a block of video data using context adaptive binary arithmetic coding (CABAC), wherein CABAC uses a context set including one or more contexts, and code a Cr chroma coded block flag using CABAC, wherein CABAC uses the same context set as the Cb chroma coded block flag. Video encoder 20 and video decoder 30 may be further configured to select a context from the one or more contexts based on a transform depth of a transform unit associated with the block of video data.

In one proposal for HEVC, there are twelve context sets for both the coeff_abs_level_greater1_flag and the coeff_abs_level_greater2_flag. The coeff_abs_level_greater1_flag indicates if a transform coefficient has an absolute value greater than 1. The coeff_abs_level_greater2_flag indicates if a transform coefficient has an absolute value greater than 2. The context sets are equally assigned for the luma and chroma component, i.e., 6 context sets for luma and 6 contexts for chroma. Each context set consists of 5 contexts. The index of the context set, ctxSet, is selected based on the previous coeff_abs_level_greater1_flag. For coeff_abs_level_greater1_flag, the index of the context within a context set, greater1Ctx, is determined based on the trailing ones to a maximum of 4. The context index can be represented as:

$$ctx\text{Idx\_level\_greater1}=(ctx\text{Set}*5)+\text{Min}(4,greater1Ctx) \quad (1)$$

For coeff_abs_level_greater2_flag, the index of the context within a context set, greater2Ctx, is based on the number of coeff_abs_level_greater1_flag being 1 to a maximum of 4. The context index can be represented as:

$$ctx\text{Idx\_level\_greater2}=(ctx\text{Set}*5)+\text{Min}(4,greater2Ctx) \quad (2)$$

greater1Ctx based on the number for the significant coefficients and the number of the coefficients that are greater than 1. On the other hand, greater2Ctx based on the number of the coefficients that are greater than 1.

In some examples, a different number of contexts may be used in different context sets, including, for example:

1. Context sets for level greater than 1 or for level greater than 2 could have different number of contexts. For example, context set 0 and 3 could have 5 contexts and the rest of the context sets could have 2 contexts.
2. Context sets for luma coefficient can have different number of contexts compared to context sets for chroma component. For example, the context set 0 for luma can have 5 contexts and the context set 0 for chroma could have 4 contexts.
3. Context set for level greater than 1 can have different contexts number than the context set for level greater than 2. For example, context set 0 for level great than 1 could have 5 contexts and context set 0 for level greater than 2 could only have 3 contexts.

In other examples, a different number for context sets may be used for coding of greater than 1 or greater than 2, including, for example:

1. Context sets for luma coefficient can have different number of contexts set to the context sets used for chroma component. For example, the luma could use 6 contexts and the chroma could use 4 contexts.
2. Context sets for greater than 1 can have different number of contexts set to the context sets used greater than 2. For example, the greater than 1 could use 6 contexts and the greater than 2 could use 4 contexts.

Optionally, a metric is used to determine which context is being used in a context set and the range of value of the metric is greater than the number for the contexts in the context set. In one such aspect, one context could be associated to one or more values of the metric. The context sharing is preferably limited to continuous values. For example, let the value of the metric be y. y=2 is associated to the context 3, and y=1 and y=4 can also be associate to the context 3. However, if y=3 is associate to the context 4, y=4 cannot be associated to the context 3.

For example, for coeff_abs_level_greater1_flag, context set 0 and 3 have 5 contexts and context set 1, 2, 4 and 5 have 2 contexts. For coeff_abs_level_greater2_flag, context set 0, 1, and 2 have 5 contexts and context set 3, 4, and 5 have 2 contexts. It can be represented as:

$$ctx\text{Idx\_level\_greater1}=(ctx\text{Set}*5)+\text{Min}(\text{Thres\_greater1},greater1Ctx) \quad (3)$$

if ctxSet=0 or ctxSet=3, Thres_greater1=4;

otherwise, Thres_greater1=1.

$$ctx\text{Idx\_level\_greater2}=(ctx\text{Set}*5)+\text{Min}(\text{Thres\_greater2},greater2Ctx) \quad (4)$$

if ctxSet<3, Thres_greater2=4;

otherwise, Thres_greater2=1

Thres_greater1 and Thres_greater2 can be chosen differently based on the following situations:

1. Luma or chroma component
2. Context sets

As another example, for coeff_abs_level_greater1_flag, context set 0 and 3 have 5 contexts and context set 1, 2, 4 and 5 have 3 contexts. For coeff_abs_level_greater2_flag, context set 0, 1, and 2 have 5 contexts and context set 3, 4, and 5 have 2 contexts. It can be represented as:

$$ctx\text{Idx\_level\_greater1}=(ctx\text{Set}*5)+greater1Ctx\_\text{mapped} \quad (3)$$

$$ctx\text{Idx\_level\_greater2}=(ctx\text{Set}*5)+greater2Ctx\_\text{mapped} \quad (4)$$

In such examples, the map can be as shown in Tables 19 and 20:

TABLE 19

| greater1Ctx | 0 | 1 | 2 | 3 | >3 |
|---|---|---|---|---|---|
| ctxSet 0 | 0 | 1 | 2 | 3 | 4 |
| ctxSet 1 | 0 | 1 | 1 | 2 | 2 |
| ctxSet 2 | 0 | 1 | 1 | 1 | 2 |
| ctxSet 3 | 0 | 1 | 2 | 3 | 4 |
| ctxSet 4 | 0 | 1 | 2 | 2 | 2 |
| ctxSet 5 | 0 | 1 | 1 | 2 | 2 |

TABLE 20

| greater2Ctx | 0 | 1 | 2 | 3 | >3 |
|---|---|---|---|---|---|
| ctxSet 0 | 0 | 1 | 2 | 3 | 4 |
| ctxSet 1 | 0 | 1 | 1 | 1 | 1 |
| ctxSet 2 | 0 | 1 | 1 | 1 | 1 |
| ctxSet 3 | 0 | 1 | 2 | 3 | 4 |
| ctxSet 4 | 0 | 1 | 1 | 1 | 1 |
| ctxSet 5 | 0 | 1 | 1 | 1 | 1 |

The CABAC initialization tables of coeff_abs_level_greater1_flag and coeff_abs_level_greater2_flag are also modified for the context sets for Thres_greater1 or Thres_greater2 equal to 1. The modifications move the initialization of the fifth context ahead to be the initialization of the second context. This proposed method reduces the number of the contexts from 120 to 78.

TABLE 21

Coding performance of the proposed method on coeff_abs_level_greater1_flag and coeff_abs_level_greater2_flag.

| BD-rate | All Intra HE | | | Random access HE | | | Low delay B HE | | |
| --- | --- | --- | --- | --- | --- | --- | --- | --- | --- |
| | Y | U | V | Y | U | V | Y | U | V |
| Class A | 0.00% | −0.04% | 0.03% | 0.05% | 0.31% | −0.35% | | | |
| Class B | 0.01% | 0.04% | 0.03% | 0.01% | 0.03% | −0.09% | 0.00% | −0.15% | −0.23% |
| Class C | 0.00% | 0.05% | 0.00% | 0.03% | 0.06% | 0.06% | 0.00% | 0.23% | −0.23% |
| Class D | 0.00% | 0.01% | −0.03% | 0.01% | 0.22% | 0.04% | −0.01% | 0.26% | 0.24% |
| Class E | 0.00% | −0.02% | 0.03% | | | | 0.09% | −0.52% | 0.16% |
| All | 0.00% | 0.01% | 0.01% | 0.02% | 0.15% | −0.09% | 0.01% | −0.02% | −0.04% |
| Enc T[%] | | | | | | | | | |
| Dec T[%] | | | | | | | | | |

Table 21 lists the number of the contexts for all the syntax elements mentioned in previous sections. The total reduction is 56 contexts.

TABLE 22

Comparison of number of contexts in the proposed method and HM4.0

| # of Contexts | HM4.0 | Proposed method |
| --- | --- | --- |
| pred_type | 10 | 6 |
| merge_idx | 4 | 1 |
| inter_pred_flag | 4 | 3 |
| ref_idx_lc, ref_idx_10, ref_idx_11 | 3 | 2 |
| cbf_cb, cbf_cr | 10 | 5 |
| coeff_abs_level_greater1_flag | 60 | 36 |
| coeff_abs_level_greater2_flag | 60 | 42 |
| Total | 151 | 95 |

Figure 2:
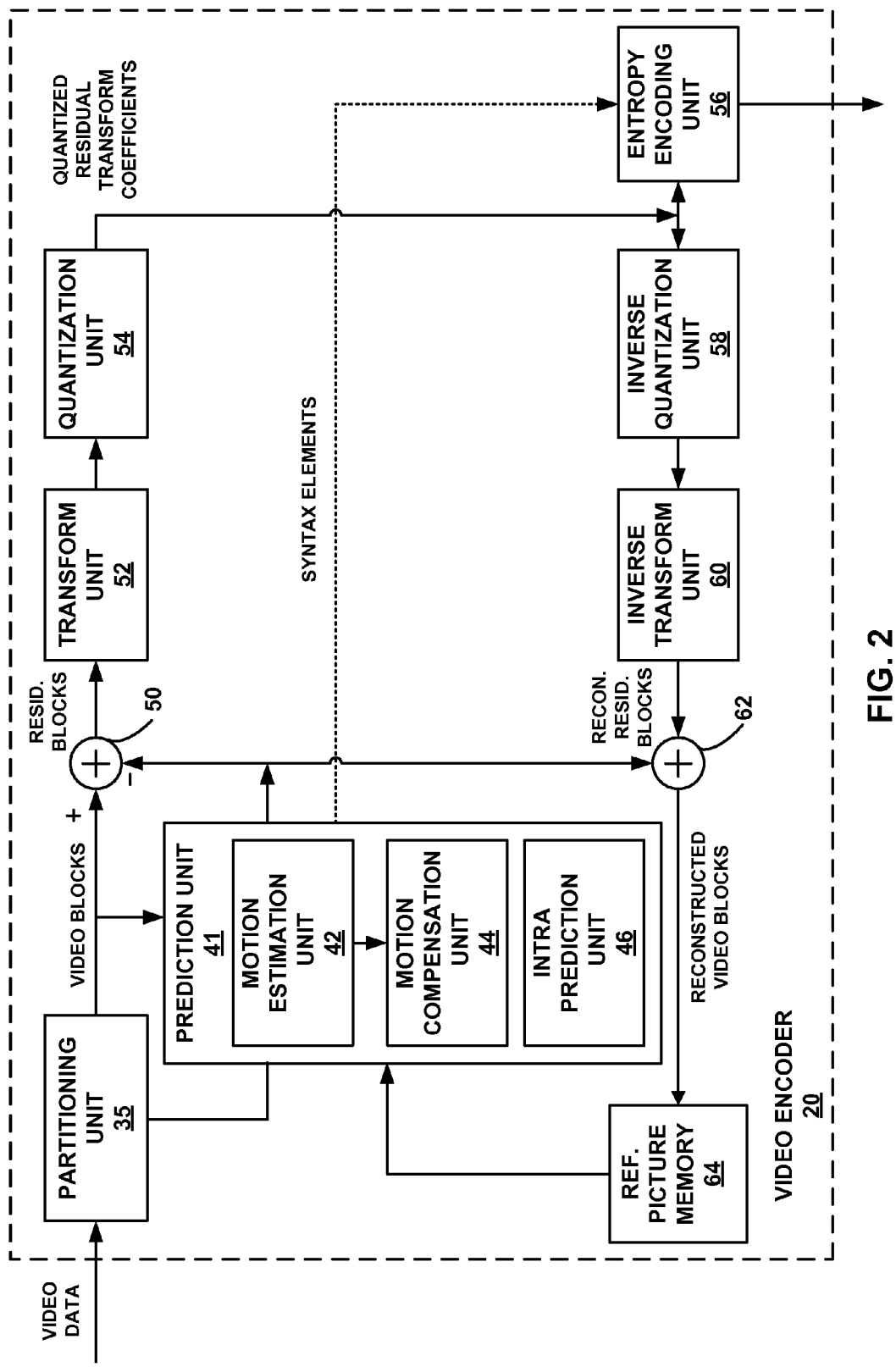
FIG. 2 is a block diagram illustrating an example video encoder that may implement the techniques described in this disclosure.

FIG. 2 is a block diagram illustrating an example video encoder 20 that may implement the techniques described in this disclosure. Video encoder 20 may perform intra- and inter-coding of video blocks within video slices. Intra-coding relies on spatial prediction to reduce or remove spatial redundancy in video within a given video frame or picture. Inter-coding relies on temporal prediction to reduce or remove temporal redundancy in video within adjacent frames or pictures of a video sequence. Intra-mode (I mode) may refer to any of several spatial based compression modes. Inter-modes, such as uni-directional prediction (P mode) or bi-prediction (B mode), may refer to any of several temporal-based compression modes.

In the example of FIG. 2, video encoder 20 includes a partitioning unit 35, prediction unit 41, reference picture memory 64, summer 50, transform unit 52, quantization unit 54, and entropy encoding unit 56. Prediction unit 41 includes motion estimation unit 42, motion compensation unit 44, and intra prediction unit 46. For video block reconstruction, video encoder 20 also includes inverse quantization unit 58, inverse transform unit 60, and summer 62. A deblocking filter (not shown in FIG. 2) may also be included to filter block boundaries to remove blockiness artifacts from reconstructed video. If desired, the deblocking filter would typically filter the output of summer 62. Additional loop filters (in loop or post loop) may also be used in addition to the deblocking filter.

As shown in FIG. 2, video encoder 20 receives video data, and partitioning unit 35 partitions the data into video blocks. This partitioning may also include partitioning into slices, tiles, or other larger units, as wells as video block partitioning, e.g., according to a quadtree structure of LCUs and CUs. Video encoder 20 generally illustrates the components that encode video blocks within a video slice to be encoded. The slice may be divided into multiple video blocks (and possibly into sets of video blocks referred to as tiles). Prediction unit 41 may select one of a plurality of possible coding modes, such as one of a plurality of intra coding modes or one of a plurality of inter coding modes, for the current video block based on error results (e.g., coding rate and the level of distortion). Prediction unit 41 may provide the resulting intra- or inter-coded block to summer 50 to generate residual block data and to summer 62 to reconstruct the encoded block for use as a reference picture.

Intra prediction unit 46 within prediction unit 41 may perform intra-predictive coding of the current video block relative to one or more neighboring blocks in the same frame or slice as the current block to be coded to provide spatial compression. Motion estimation unit 42 and motion compensation unit 44 within prediction unit 41 perform inter-predictive coding of the current video block relative to one or more predictive blocks in one or more reference pictures to provide temporal compression.

Motion estimation unit 42 may be configured to determine the inter-prediction mode for a video slice according to a predetermined pattern for a video sequence. The predetermined pattern may designate video slices in the sequence as P slices, B slices or GPB (generalized P/B) slices. Motion estimation unit 42 and motion compensation unit 44 may be highly integrated, but are illustrated separately for conceptual purposes. Motion estimation, performed by motion estimation unit 42, is the process of generating motion vectors, which estimate motion for video blocks. A motion vector, for example, may indicate the displacement of a PU of a video block within a current video frame or picture relative to a predictive block within a reference picture.

A predictive block is a block that is found to closely match the PU of the video block to be coded in terms of pixel difference, which may be determined by sum of absolute difference (SAD), sum of square difference (SSD), or other difference metrics. In some examples, video encoder 20 may calculate values for sub-integer pixel positions of reference pictures stored in reference picture memory 64. For example, video encoder 20 may interpolate values of one-quarter pixel positions, one-eighth pixel positions, or other fractional pixel positions of the reference picture. Therefore, motion estimation unit 42 may perform a motion search relative to the full pixel positions and fractional pixel positions and output a motion vector with fractional pixel precision.

Motion estimation unit 42 calculates a motion vector for a PU of a video block in an inter-coded slice by comparing the position of the PU to the position of a predictive block of a reference picture. The reference picture may be selected from a first reference picture list (List 0) or a second reference picture list (List 1), each of which identify one or more reference pictures stored in reference picture memory 64.

Motion estimation unit 42 sends the calculated motion vector to entropy encoding unit 56 and motion compensation unit 44.

Motion compensation, performed by motion compensation unit 44, may involve fetching or generating the predictive block based on the motion vector determined by motion estimation, possibly performing interpolations to sub-pixel precision. Upon receiving the motion vector for the PU of the current video block, motion compensation unit 44 may locate the predictive block to which the motion vector points in one of the reference picture lists. Video encoder 20 forms a residual video block by subtracting pixel values of the predictive block from the pixel values of the current video block being coded, forming pixel difference values. The pixel difference values form residual data for the block, and may include both luma and chroma difference components. Summer 50 represents the component or components that perform this subtraction operation. Motion compensation unit 44 may also generate syntax elements associated with the video blocks and the video slice for use by video decoder 30 in decoding the video blocks of the video slice.

Intra-prediction unit 46 may intra-predict a current block, as an alternative to the inter-prediction performed by motion estimation unit 42 and motion compensation unit 44, as described above. In particular, intra-prediction unit 46 may determine an intra-prediction mode to use to encode a current block. In some examples, intra-prediction unit 46 may encode a current block using various intra-prediction modes, e.g., during separate encoding passes, and intra-prediction unit 46 (or mode select unit 40, in some examples) may select an appropriate intra-prediction mode to use from the tested modes. For example, intra-prediction unit 46 may calculate rate-distortion values using a rate-distortion analysis for the various tested intra-prediction modes, and select the intra-prediction mode having the best rate-distortion characteristics among the tested modes. Rate-distortion analysis generally determines an amount of distortion (or error) between an encoded block and an original, unencoded block that was encoded to produce the encoded block, as well as a bit rate (that is, a number of bits) used to produce the encoded block. Intra-prediction unit 46 may calculate ratios from the distortions and rates for the various encoded blocks to determine which intra-prediction mode exhibits the best rate-distortion value for the block.

In any case, after selecting an intra-prediction mode for a block, intra-prediction unit 46 may provide information indicative of the selected intra-prediction mode for the block to entropy coding unit 56. Entropy coding unit 56 may encode the information indicating the selected intra-prediction mode in accordance with the techniques of this disclosure. Video encoder 20 may include in the transmitted bitstream configuration data, which may include a plurality of intra-prediction mode index tables and a plurality of modified intra-prediction mode index tables (also referred to as codeword mapping tables), definitions of encoding contexts for various blocks, and indications of a most probable intra-prediction mode, an intra-prediction mode index table, and a modified intra-prediction mode index table to use for each of the contexts.

After prediction unit 41 generates the predictive block for the current video block via either inter-prediction or intra-prediction, video encoder 20 forms a residual video block by subtracting the predictive block from the current video block. The residual video data in the residual block may be included in one or more TUs and applied to transform unit 52. Transform unit 52 transforms the residual video data into residual transform coefficients using a transform, such as a discrete cosine transform (DCT) or a conceptually similar transform.

Transform unit 52 may convert the residual video data from a pixel domain to a transform domain, such as a frequency domain.

Transform unit 52 may send the resulting transform coefficients to quantization unit 54. Quantization unit 54 quantizes the transform coefficients to further reduce bit rate. The quantization process may reduce the bit depth associated with some or all of the coefficients. The degree of quantization may be modified by adjusting a quantization parameter. In some examples, quantization unit 54 may then perform a scan of the matrix including the quantized transform coefficients. Alternatively, entropy encoding unit 56 may perform the scan. As one example, the coding techniques described in this disclosure may be performed fully or partially by entropy encoding unit 56. However, aspects of this disclosure are not so limited. For example, the coding techniques described in this disclosure may be performed by a component of video encoder 20 not shown in FIG. 2, such as a processor or any other component. In some examples, the coding techniques of this disclosure may be performed by one of the other units or modules illustrated in FIG. 2. In yet some other examples, the coding techniques of this disclosure may be performed by a combination of units and modules of video encoder 20. In this way, video encoder 20 may be configured to perform the example techniques described in this disclosure.

Following quantization, entropy encoding unit 56 entropy encodes the quantized transform coefficients. For example, entropy encoding unit 56 may perform context adaptive variable length coding (CAVLC), context adaptive binary arithmetic coding (CABAC), syntax-based context-adaptive binary arithmetic coding (SBAC), probability interval partitioning entropy (PIPE) coding or another entropy encoding methodology or technique. Following the entropy encoding by entropy encoding unit 56, the encoded bitstream may be transmitted to video decoder 30, or archived for later transmission or retrieval by video decoder 30. Entropy encoding unit 56 may also entropy encode the motion vectors and the other syntax elements for the current video slice being coded.

In one example of the disclosure, entropy encoding unit 56 may be configured to determine a first prediction type for a block of video data in a P slice, represent the first prediction type as a P-slice prediction type syntax element, determine a second prediction type for a block of video data in a B slice, represent the second prediction type as a B-slice prediction type syntax element, determine a P-slice binarization for the P-slice prediction type syntax element, determine a B-slice binarization for the B-slice prediction type syntax element, wherein the P-slice prediction type syntax element and the B-slice prediction type syntax element are determined using the same binarization logic, and encode the video data based on the binarizations of the P-slice prediction type syntax element and the B-slice prediction syntax element.

In another example of the disclosure, entropy encoding unit 56 may be configured to determine a partition type for a prediction mode for a block of video data, encode a partition type bin of a prediction type syntax element for the block of video data using context adaptive binary arithmetic coding with a single context, wherein the single context is the same for any partition type, and encode a partition size bin of a prediction type syntax for the block of video data using context adaptive binary arithmetic coding in bypass mode.

In another example of the disclosure, entropy encoding unit 56 may be configured to code a Cb chroma coded block flag for a block of video data using context adaptive binary arithmetic coding (CABAC), wherein CABAC uses a context set including one or more contexts, and code a Cr chroma coded block flag using CABAC, wherein CABAC uses the same context set as the Cb chroma coded block flag. Video encoder 20 and video decoder 30 may be further configured to select a context from the one or more contexts based on a transform depth of a transform unit associated with the block of video data.

Inverse quantization unit 58 and inverse transform unit 60 apply inverse quantization and inverse transformation, respectively, to reconstruct the residual block in the pixel domain for later use as a reference block of a reference picture. Motion compensation unit 44 may calculate a reference block by adding the residual block to a predictive block of one of the reference pictures within one of the reference picture lists. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reference block for storage in reference picture memory 64. The reference block may be used by motion estimation unit 42 and motion compensation unit 44 as a reference block to inter-predict a block in a subsequent video frame or picture.

Figure 3:
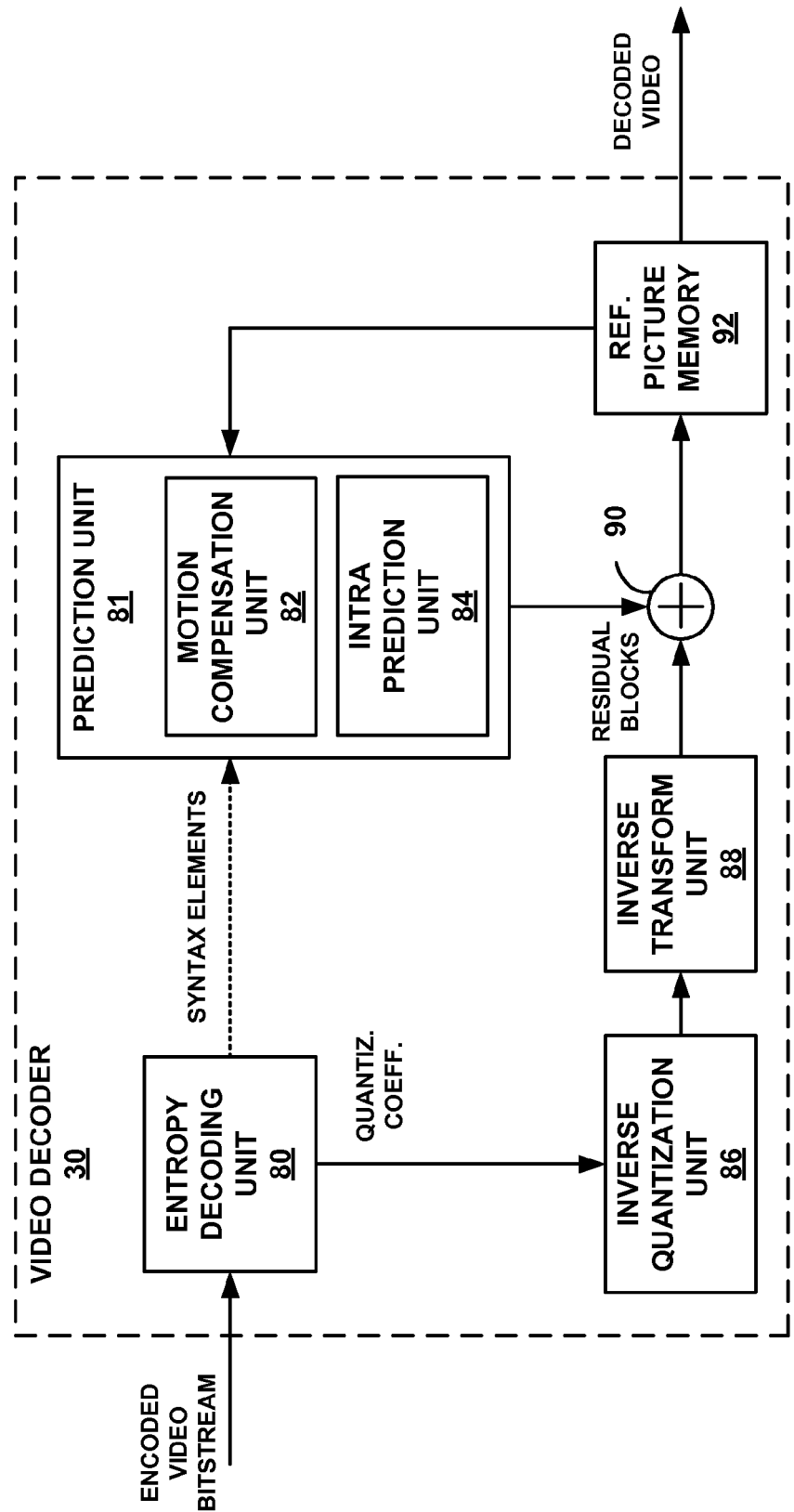
FIG. 3 is a block diagram illustrating an example video decoder that may implement the techniques described in this disclosure.

FIG. 3 is a block diagram illustrating an example video decoder 30 that may implement the techniques described in this disclosure. In the example of FIG. 3, video decoder 30 includes an entropy decoding unit 80, prediction unit 81, inverse quantization unit 86, inverse transformation unit 88, summer 90, and reference picture memory 92. Prediction unit 81 includes motion compensation unit 82 and intra prediction unit 84. Video decoder 30 may, in some examples, perform a decoding pass generally reciprocal to the encoding pass described with respect to video encoder 20 from FIG. 2.

During the decoding process, video decoder 30 receives an encoded video bitstream that represents video blocks of an encoded video slice and associated syntax elements from video encoder 20. Entropy decoding unit 80 of video decoder 30 entropy decodes the bitstream to generate quantized coefficients, motion vectors, and other syntax elements. Entropy decoding unit 80 forwards the motion vectors and other syntax elements to prediction unit 81. Video decoder 30 may receive the syntax elements at the video slice level and/or the video block level.

As one example, the coding techniques described in this disclosure may be performed fully or partially by entropy decoding unit 80. However, aspects of this disclosure are not so limited. For example, the coding techniques described in this disclosure may be performed by a component of video decoder 30 not shown in FIG. 3, such as a processor or any other component. In some examples, the coding techniques of this disclosure may be performed by one of the other units or modules illustrated in FIG. 3. In yet some other examples, the coding techniques of this disclosure may be performed by a combination of units and modules of video decoder 30. In this way, video decoder 30 may be configured to perform the example techniques described in this disclosure.

In one example of the disclosure, entropy decoding unit 80 may be configured to map a binarized P-slice prediction type syntax element to a prediction type using a binarization mapping for a block of video data in a P slice, map a binarized B-slice prediction type syntax element to a prediction type using the same binarization mapping for a block of video data in a B slice, and decode the video data based on the mapped prediction types.

In one example of the disclosure, entropy decoding unit 80 may be configured to receive a prediction type syntax element for a block of video data that has been coded using context adaptive binary arithmetic coding (CABAC), the prediction type syntax element including a partition type bin representing a partition type and a partition size bin representing a partition size, decoding the partition type bin of the prediction type syntax element using context adaptive binary arithmetic coding with a single context, wherein the single context is the same for any partition type, and decoding the partition size bin of the prediction type syntax for a block of video data using context adaptive binary arithmetic coding in bypass mode.

In another example of the disclosure, entropy decoding unit 80 may be configured to code a Cb chroma coded block flag for a block of video data using context adaptive binary arithmetic coding (CABAC), wherein CABAC uses a context set including one or more contexts, and code a Cr chroma coded block flag using CABAC, wherein CABAC uses the same context set as the Cb chroma coded block flag. Video encoder 20 and video decoder 30 may be further configured to select a context from the one or more contexts based on a transform depth of a transform unit associated with the block of video data.

When the video slice is coded as an intra-coded (I) slice, intra prediction unit 84 of prediction unit 81 may generate prediction data for a video block of the current video slice based on a signaled intra prediction mode and data from previously decoded blocks of the current frame or picture. When the video frame is coded as an inter-coded (i.e., B, P or GPB) slice, motion compensation unit 82 of prediction unit 81 produces predictive blocks for a video block of the current video slice based on the motion vectors and other syntax elements received from entropy decoding unit 80. The predictive blocks may be produced from one of the reference pictures within one of the reference picture lists. Video decoder 30 may construct the reference frame lists, List 0 and List 1, using default construction techniques based on reference pictures stored in reference picture memory 92.

Motion compensation unit 82 determines prediction information for a video block of the current video slice by parsing the motion vectors and other syntax elements, and uses the prediction information to produce the predictive blocks for the current video block being decoded. For example, motion compensation unit 82 uses some of the received syntax elements to determine a prediction mode (e.g., intra- or inter-prediction) used to code the video blocks of the video slice, an inter-prediction slice type (e.g., B slice, P slice, or GPB slice), construction information for one or more of the reference picture lists for the slice, motion vectors for each inter-encoded video block of the slice, inter-prediction status for each inter-coded video block of the slice, and other information to decode the video blocks in the current video slice.

Motion compensation unit 82 may also perform interpolation based on interpolation filters. Motion compensation unit 82 may use interpolation filters as used by video encoder 20 during encoding of the video blocks to calculate interpolated values for sub-integer pixels of reference blocks. In this case, motion compensation unit 82 may determine the interpolation filters used by video encoder 20 from the received syntax elements and use the interpolation filters to produce predictive blocks.

Inverse quantization unit 86 inverse quantizes, i.e., de-quantizes, the quantized transform coefficients provided in the bitstream and decoded by entropy decoding unit 80. The inverse quantization process may include use of a quantization parameter calculated by video encoder 20 for each video block in the video slice to determine a degree of quantization and, likewise, a degree of inverse quantization that should be applied. Inverse transform unit 88 applies an inverse transform, e.g., an inverse DCT, an inverse integer transform, or a conceptually similar inverse transform process, to the transform coefficients in order to produce residual blocks in the pixel domain.

After motion compensation unit 82 generates the predictive block for the current video block based on the motion vectors and other syntax elements, video decoder 30 forms a decoded video block by summing the residual blocks from inverse transform unit 88 with the corresponding predictive blocks generated by motion compensation unit 82. Summer 90 represents the component or components that perform this summation operation. If desired, a deblocking filter may also be applied to filter the decoded blocks in order to remove blockiness artifacts. Other loop filters (either in the coding loop or after the coding loop) may also be used to smooth pixel transitions, or otherwise improve the video quality. The decoded video blocks in a given frame or picture are then stored in reference picture memory 92, which stores reference pictures used for subsequent motion compensation. Reference picture memory 92 also stores decoded video for later presentation on a display device, such as display device 32 of FIG. 1.

Figure 6:
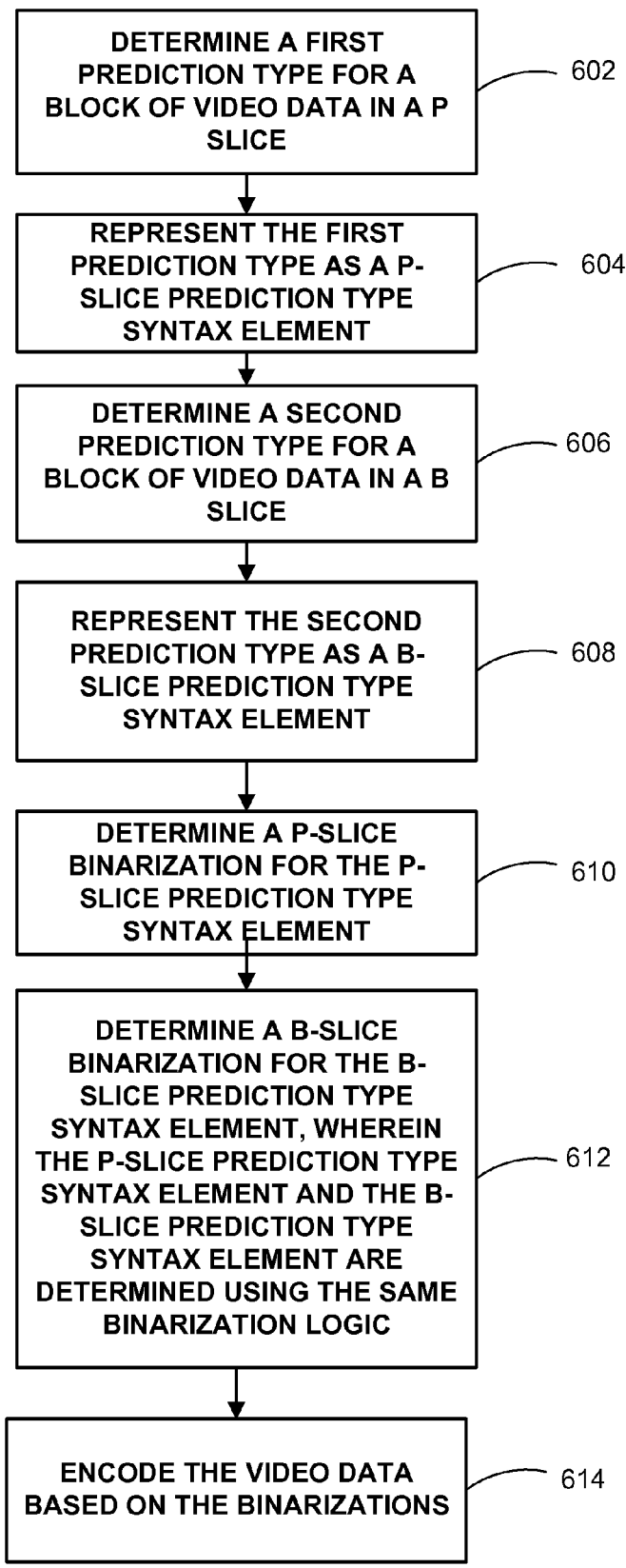
FIG. 6 is a flowchart illustrating an example video encoding method of the disclosure.

FIG. 6 is a flowchart illustrating an example video encoding method of the disclosure. The method of FIG. 6 may be implemented by video encoder 20. Video encoder 20 may be configured to determine a first prediction type for a block of video data in a P slice (602), and to represent the first prediction type as a P-slice prediction type syntax element (604). Video encoder 20 may be further configured to determine a second prediction type for a block of video data in a B slice (606), and to represent the second prediction type as a B-slice prediction type syntax element (608). The P-slice prediction type syntax element and the B-slice prediction type syntax element specify a prediction mode and a partition type. The prediction mode may include one of inter-prediction and intra-prediction. The partition type may include one of symmetric partitions and asymmetric partitions.

Video encoder 20 may be further configured to determine a P-slice binarization for the P-slice prediction type syntax element (610), and to determine a B-slice binarization for the B-slice prediction type syntax element, wherein the P-slice prediction type syntax element and the B-slice prediction type syntax element are determined using the same binarization logic (612). Video encoder 20 may then encode the video data based on the binarizations of the P-slice prediction type syntax element and the B-slice prediction syntax element (614).

Encoding the video data may comprise binarizing the P-slice prediction type syntax element with the determined P-slice binarizations, binarizing the B-slice prediction type syntax element with the determined B-slice binarizations, applying context adaptive binary arithmetic coding (CABAC) to the binarized P-slice prediction type syntax element, and applying context adaptive binary arithmetic coding (CABAC) to the binarized B-slice prediction type syntax element.

Figure 7:
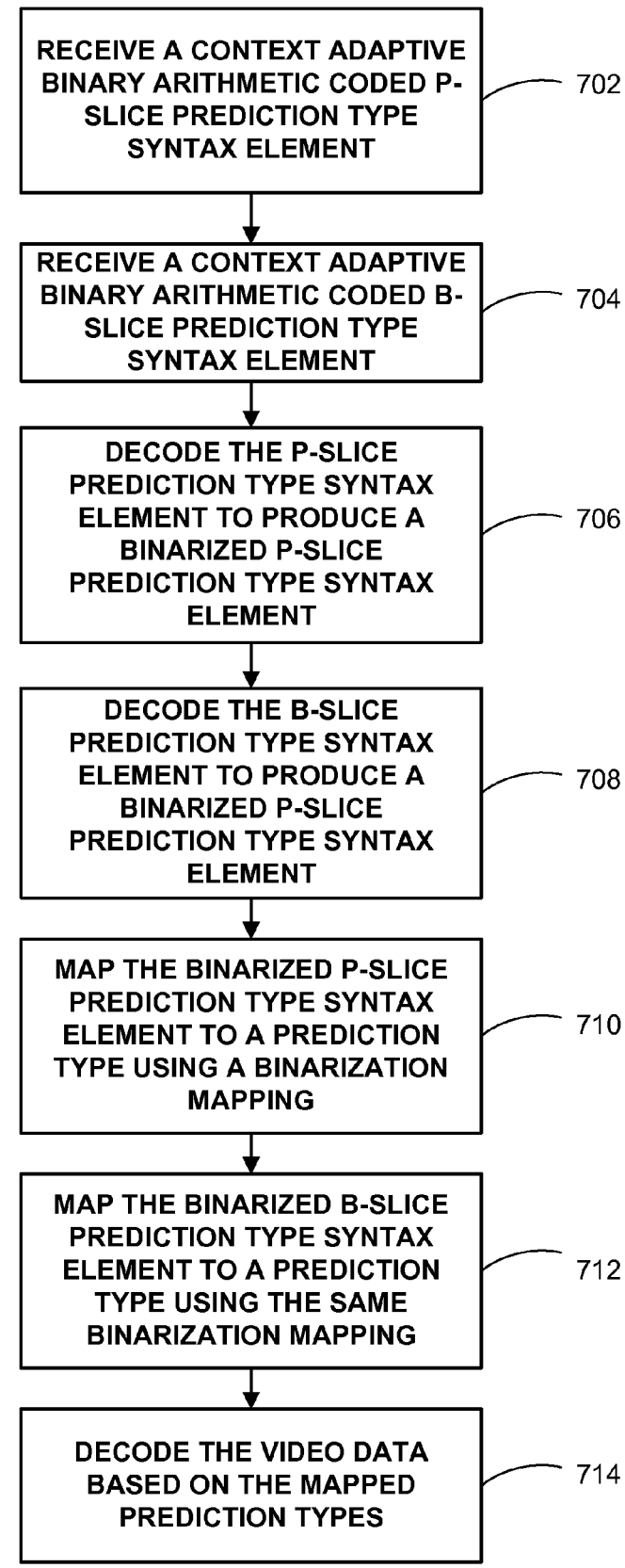
FIG. 7 is a flowchart illustrating an example video decoding method of the disclosure.

FIG. 7 is a flowchart illustrating an example video decoding method of the disclosure. The method of FIG. 7 may be implemented by video decoder 30. Video decoder 30 may be configured to receive a context adaptive binary arithmetic coded P-slice prediction type syntax element which indicates the prediction type for the block of video data in a P slice (702), and to receive a context adaptive binary arithmetic coded B-slice prediction type syntax element which indicates the prediction type for the block of video data in a B slice (704). The P-slice prediction type syntax element and the B-slice prediction type syntax element specify a prediction mode and a partition type. The prediction mode may include one of inter-prediction and intra-prediction. The partition type may include one of symmetric partitions and asymmetric partitions.

Video decoder 30 may be further configured to decode the P-slice prediction type syntax element to produce a binarized P-slice prediction type syntax element (706), and to decode the B-slice prediction type syntax element to produce a binarized B-slice prediction type syntax element (708). Video decoder 30 may be further configured to map the binarized P-slice prediction type syntax element to a prediction type using a binarization mapping for a block of video data in a P slice (710), and to map the binarized B-slice prediction type syntax element to a prediction type using the same binarization mapping for a block of video data in a B slice (712). Video decoder 30 may then decode the video data based on the mapped prediction types (714).

Figure 8:
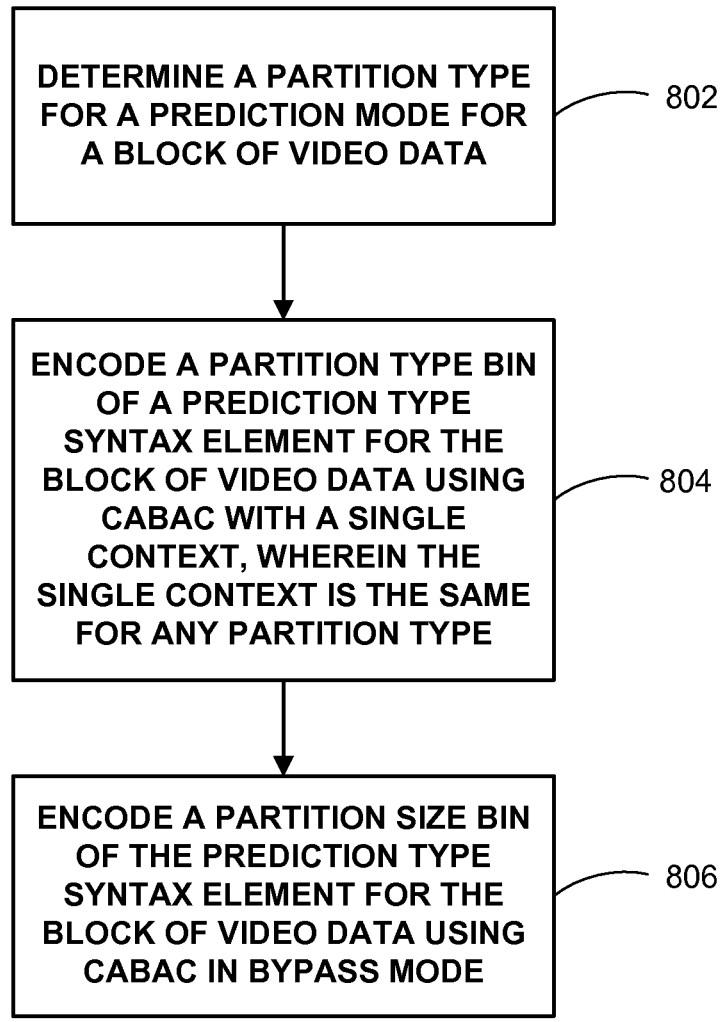
FIG. 8 is a flowchart illustrating an example video encoding method of the disclosure.

FIG. 8 is a flowchart illustrating an example video encoding method of the disclosure. The method of FIG. 8 may be implemented by video encoder 20. Video encoder 20 may be configured to determine a partition type for a prediction mode for a block of video data (802) and to encode a partition type bin of a prediction type syntax element for the block of video data using context adaptive binary arithmetic coding (CABAC) with a single context (804). The single context is the same for any partition type. In one example, the partition type is an asymmetric partition and the partition type bin indicates whether the asymmetric partition is vertically partitioned or horizontally partitioned. For example, the partition size bin indicates whether a first partition is one-quarter of a size of the block of video data or whether the first partition is three-quarters of the size of the block of video data.

Video encoder 20 may be further configured to encode a partition size bin of the prediction type syntax element for the block of video data using CABAC in bypass mode (806).

Figure 9:
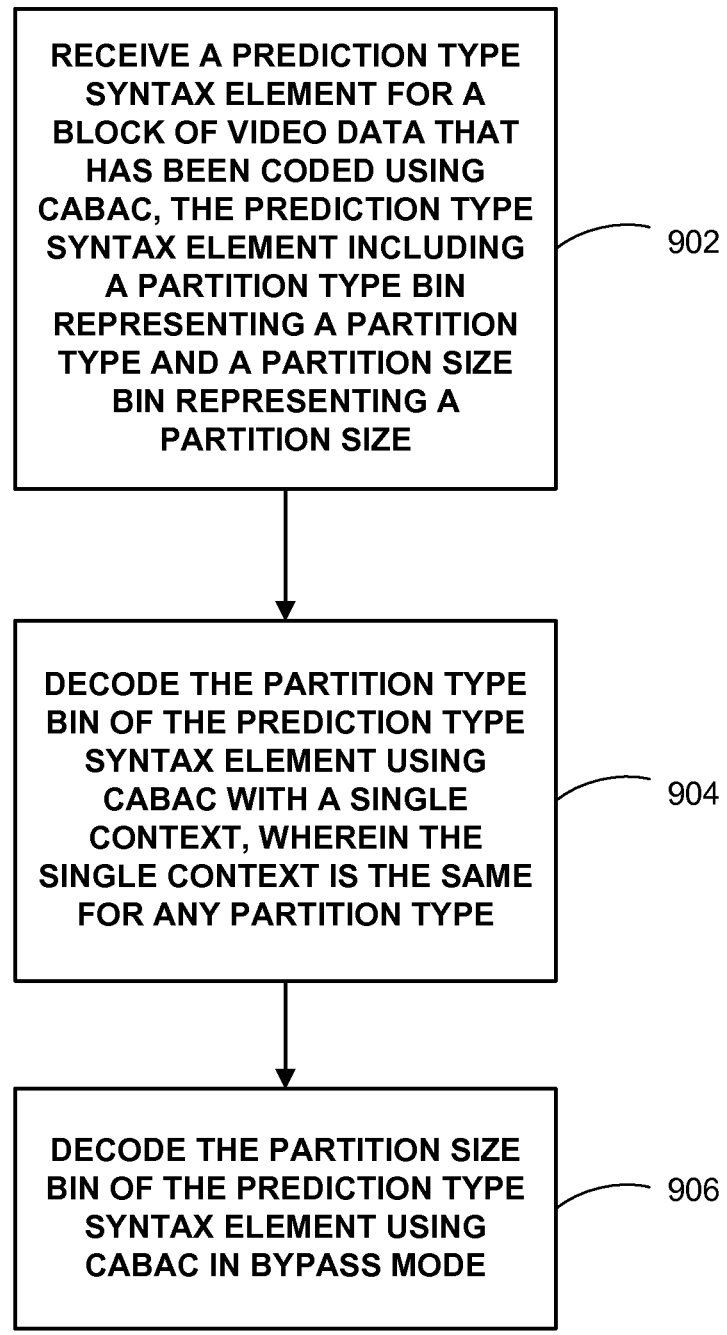
FIG. 9 is a flowchart illustrating an example video decoding method of the disclosure.

FIG. 9 is a flowchart illustrating an example video decoding method of the disclosure. The method of FIG. 9 may be implemented by video decoder 30. Video decoder 30 may be configured to receive a prediction type syntax element for a block of video data that has been coded using context adaptive binary arithmetic coding (CABAC), the prediction type syntax element including a partition type bin representing a partition type and a partition size bin representing a partition size (902). In one example, the partition type is an asymmetric partition and the partition type bin indicates whether the asymmetric partition is vertically partitioned or horizontally partitioned. For example, the partition size bin indicates whether a first partition is one-quarter of a size of the block of video data or whether the first partition is three-quarters of the size of the block of video data.

Video decoder 30 may be further configured to decode the partition type bin of the prediction type syntax element using CABAC with a single context, wherein the single context is the same for any partition type (904), and to decode the partition size bin of the prediction type syntax element using CABAC in bypass mode (906).

Figure 10:
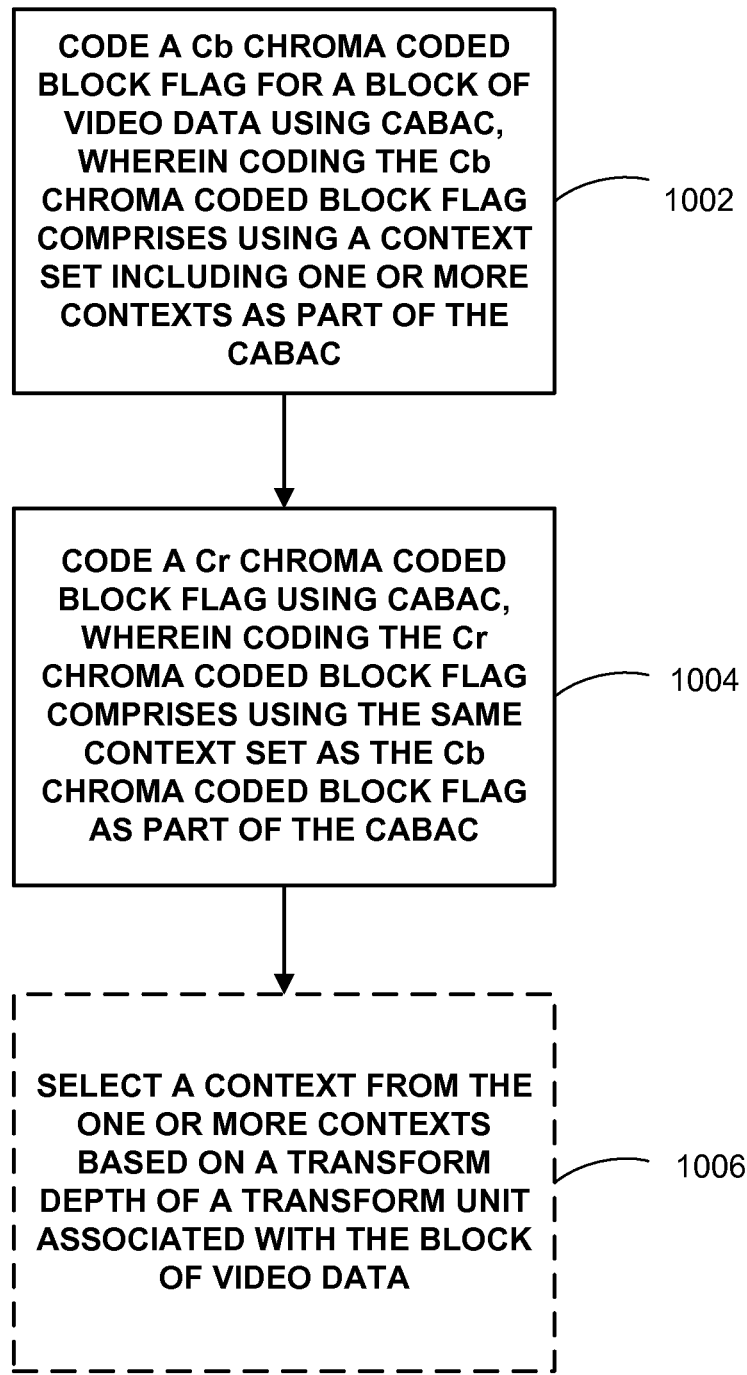
FIG. 10 is a flowchart illustrating an example video coding method of the disclosure.

FIG. 10 is a flowchart illustrating an example video coding method of the disclosure. The method of FIG. 10 may be implemented by either video encoder 20 or video decoder. For the purposes of FIG. 10, video encoder 20 and video decoder 30 will be referred to, collectively, as a video coder. In accordance with techniques of FIG. 10, a video coder may be configured to code a Cb chroma coded block flag for a block of video data using context adaptive binary arithmetic coding (CABAC), wherein coding the Cb chroma coded block flag comprises using a context set including one or more contexts as part of the CABAC (1002), and to code a Cr chroma coded block flag using CABAC, wherein coding the Cr chroma coded block flag comprises using the same context set as the Cb chroma coded block flag as part of the CABAC (1004). In one example, the context set includes 5 contexts.

In one optional example of the disclosure, a video coder may be further configured to select a context from the one or more contexts based on a transform depth of a transform unit associated with the block of video data (1006).

When operating as a video encoder, a video coder may be further configured to signal the coded Cb chroma coded block flag in an encoded video bitstream, and to signal the coded Cr chroma coded block flag in the encoded video bitstream. When operating as a video decoder, a video coder may be further configured to receive the coded Cb chroma coded block flag in an encoded video bitstream, and to receive the coded Cr chroma coded block flag in the encoded video bitstream.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of encoding video data, the method comprising:
   determining a first prediction type for a block of video data in a P slice;
   representing the first prediction type as a P slice prediction type syntax element;
   determining a second prediction type for a block of video data in a B slice;
   representing the second prediction type as a B slice prediction type syntax element;
   determining a third prediction type for a block of video data in an I slice;
   representing the third prediction type as an I slice prediction type syntax element;
   determining a P slice binarization for the P slice prediction type syntax element using a first binarization mapping;
   determining a B slice binarization for the B slice prediction type syntax element using the first binarization mapping;
   determining an I slice binarization for the I slice prediction type syntax element using a second binarization mapping, the second binarization mapping being different than the first binarization mapping; and
   encoding the video data based on the binarizations of the P slice prediction type syntax element, the B slice prediction type syntax element, and the I slice prediction type syntax element, wherein each of the first prediction type, second prediction type, and third prediction type specifies a respective prediction mode and a respective partition type.

2. The method of claim 1, wherein encoding the video data comprises:
   binarizing the P slice prediction type syntax element with the determined P slice binarization;
   binarizing the B slice prediction type syntax element with the determined B slice binarization;
   binarizing the I slice prediction type syntax element with the determined I slice binarization;
   applying context adaptive binary arithmetic coding (CABAC) to the binarized P slice prediction type syntax element;
   applying CABAC to the binarized B slice prediction type syntax element; and
   applying CABAC to the binarized I slice prediction type syntax element.

3. The method of claim 1, wherein the prediction mode includes one of inter-prediction and intra-prediction.

4. The method of claim 1, wherein the partition type includes one of symmetric partitions and asymmetric partitions.

5. A method of decoding video data, the method comprising:
   mapping a binarized P slice prediction type syntax element to a first prediction type using a first binarization mapping for a block of video data in a P slice;
   mapping a binarized B slice prediction type syntax element to a second prediction type using the first binarization mapping for a block of video data in a B slice;
   mapping a binarized I slice prediction type syntax element to a third prediction type using a second binarization mapping for a block of video data in an I slice, the second binarization mapping being different than the first binarization mapping, wherein each of the first prediction type, second prediction type, and third prediction type specifies a respective prediction mode and a respective partition type; and
   decoding the video data based on the mapped first prediction type, second prediction type and third prediction type.

6. The method of claim 5, further comprising:
   receiving a context adaptive binary arithmetic coded P slice prediction type syntax element which indicates the first prediction type for the block of video data in the P slice;
   receiving a context adaptive binary arithmetic coded B slice prediction type syntax element which indicates the second prediction type for the block of video data in the B slice; and
   receiving a context adaptive binary arithmetic coded I slice prediction type syntax element which indicates the third prediction type for the block of video data in the I slice,
   wherein decoding the video data further comprises:
      decoding the P slice prediction type syntax element to produce the binarized P slice prediction type syntax element;
      decoding the B slice prediction type syntax element to produce the binarized B slice prediction type syntax element; and
      decoding the I slice prediction type syntax element to produce the binarized I slice prediction type syntax element.

7. The method of claim 5, wherein the prediction mode includes one of inter-prediction and intra-prediction.

8. The method of claim 5, wherein the partition type includes one of symmetric partitions and asymmetric partitions.

9. An apparatus configured to encode video data, the apparatus comprising:
   means for determining a first prediction type for a block of video data in a P slice;
   means for representing the first prediction type as a P slice prediction type syntax element;
   means for determining a second prediction type for a block of video data in a B slice;
   means for representing the second prediction type as a B slice prediction type syntax element;
   means for determining a third prediction type for a block of video data in an I slice;
   means for representing the third prediction type as an I slice prediction type syntax element;
   means for determining a P slice binarization for the P slice prediction type syntax element using a first binarization mapping;
   means for determining a B slice binarization for the B slice prediction type syntax element using the first binarization mapping;
   means for determining an I slice binarization for the I slice prediction type syntax element using a second binarization mapping, the second binarization mapping being different than the first binarization mapping; and
   means for encoding the video data based on the binarizations of the P slice prediction type syntax element, the B slice prediction type syntax element, and the I slice prediction type syntax element, wherein each of the first prediction type, second prediction type, and third prediction type specifies a respective prediction mode and a respective partition type.

10. The apparatus of claim 9, wherein the means for encoding the video data comprises:
    means for binarizing the P slice prediction type syntax element with the determined P slice binarization;
    means for binarizing the B slice prediction type syntax element with the determined B slice binarization;
    means for binarizing the I slice prediction type syntax element with the determined I slice binarization;
    means for applying context adaptive binary arithmetic coding (CABAC) to the binarized P slice prediction type syntax element;
    means for applying CABAC to the binarized B slice prediction type syntax element; and
    means for applying CABAC to the binarized I slice prediction type syntax element.

11. The apparatus of claim 9, wherein the prediction mode includes one of inter-prediction and intra-prediction.

12. The apparatus of claim 9, wherein the partition type includes one of symmetric partitions and asymmetric partitions.

13. An apparatus configured to decode video data, the apparatus comprising:
    means for mapping a binarized P slice prediction type syntax element to a first prediction type using a first binarization mapping for a block of video data in a P slice;
    means for mapping a binarized B slice prediction type syntax element to a second prediction type using the first binarization mapping for a block of video data in a B slice; means for mapping a binarized I slice prediction type syntax element to a third prediction type using a second binarization mapping for a block of video data in an I slice, the second binarization mapping being different than the first binarization mapping, wherein each of the first prediction type, second prediction type, and third prediction type specifies a respective prediction mode and a respective partition type; and
    means for decoding the video data based on the mapped first prediction type, second prediction type and third prediction type.

14. The apparatus of claim 13, further comprising:
    means for receiving a context adaptive binary arithmetic coded P slice prediction type syntax element which indicates the first prediction type for the block of video data in the P slice;
    means for receiving a context adaptive binary arithmetic coded B slice prediction type syntax element which indicates the second prediction type for the block of video data in the B slice; and
    means for receiving a context adaptive binary arithmetic coded I slice prediction type syntax element which indicates the third prediction type for the block of video data in the I slice, wherein the means for decoding the video data further comprises:
        means for decoding the P slice prediction type syntax element to produce the binarized P slice prediction type syntax element;
        means for decoding the B slice prediction type syntax element to produce the binarized B slice prediction type syntax element; and
        means for decoding the I slice prediction type syntax element to produce the binarized I slice prediction type syntax element.

15. The apparatus of claim 13, wherein the prediction mode includes one of inter-prediction and intra-prediction.

16. The apparatus of claim 13, wherein the partition type includes one of symmetric partitions and asymmetric partitions.

17. An apparatus configured to encode video data, the apparatus comprising:
    a memory configured to store the video data; and
    a video encoder configured to:
        determine a first prediction type for a block of the video data in a P slice;
        represent the first prediction type as a P slice prediction type syntax element;
        determine a second prediction type for a block of the video data in a B slice;
        represent the second prediction type as a B slice prediction type syntax element;
        determine a third prediction type for a block of video data in an I slice;
        represent the third prediction type as an I slice prediction type syntax element;
        determine a P slice binarization for the P slice prediction type syntax element using a first binarization mapping;
        determine a B slice binarization for the B slice prediction type syntax element using the first binarization mapping;
        determine an I slice binarization for the I slice prediction type syntax element using a second binarization mapping, the second binarization mapping being different than the first binarization mapping; and
        encode the video data based on the binarizations of the P slice prediction type syntax element, the B slice prediction type syntax element, and the I slice prediction type syntax element, wherein each of the first prediction type, second prediction type, and third prediction type specifies a respective prediction mode and a respective partition type.

18. The apparatus of claim 17, wherein the video encoder is further configured to:
    binarize the P slice prediction type syntax element with the determined P slice binarization;
    binarize the B slice prediction type syntax element with the determined B slice binarization;
    binarize the I slice prediction type syntax element with the determined I slice binarization;
    apply context adaptive binary arithmetic coding (CABAC) to the binarized P slice prediction type syntax element; and
    apply CABAC to the binarized B slice prediction type syntax element; and
    apply CABAC to the binarized I slice prediction type syntax element.

19. The apparatus of claim 17, wherein the prediction mode includes one of inter-prediction and intra-prediction.

20. The apparatus of claim 17, wherein the partition type includes one of symmetric partitions and asymmetric partitions.

21. An apparatus configured to decode video data, the apparatus comprising:
    a memory configured to store the video data; and
    a video decoder configured to:
        map a binarized P slice prediction type syntax element to a first prediction type using a first binarization mapping for a block of video data in a P slice;
        map a binarized B slice prediction type syntax element to a second prediction type using the first binarization mapping for a block of video data in a B slice;
        map a binarized I slice prediction type syntax element to a third prediction type using a second binarization mapping for a block of video data in an I slice, the second binarization mapping being different than the first binarization mapping, wherein each of the first prediction type, second prediction type, and third prediction type specifies a respective prediction mode and a respective partition type; and
        decode the video data based on the mapped first prediction type, second prediction type and third prediction type.

22. The apparatus of claim 21, wherein the video decoder is further configured to:
    receive a context adaptive binary arithmetic coded P slice prediction type syntax element which indicates the first prediction type for the block of video data in the P slice;
    receive a context adaptive binary arithmetic coded B slice prediction type syntax element which indicates the second prediction type for the block of video data in the B slice;
    receive a context adaptive binary arithmetic coded I slice prediction type syntax element which indicates the third prediction type for the block of video data in the I slice;
    decode the P slice prediction type syntax element to produce the binarized P slice prediction type syntax element;
    decode the B slice prediction type syntax element to produce the binarized B slice prediction type syntax element; and
    decode the I slice prediction type syntax element to produce the binarized I slice prediction type syntax element.

23. The apparatus of claim 21, wherein the prediction mode includes one of inter-prediction and intra-prediction.

24. The apparatus of claim 21, wherein the partition type includes one of symmetric partitions and asymmetric partitions.

25. A non-transitory computer-readable storage medium storing instructions that, when executed, cause one or more processors configured to encode video data to:
    determine a first prediction type for a block of video data in a P slice;
    represent the first prediction type as a P slice prediction type syntax element;
    determine a second prediction type for a block of video data in a B slice;
    represent the second prediction type as a B slice prediction type syntax element;
    determine a third prediction type for a block of video data in an I slice;
    represent the third prediction type as an I slice prediction type syntax element;
    determine a P slice binarization for the P slice prediction type syntax element using a first binarization mapping;

determine a B slice binarization for the B slice prediction type syntax element using the first binarization mapping;

determine an I slice binarization for the I slice prediction type syntax element using a second binarization mapping, the second binarization mapping being different than the first binarization mapping; and encode the video data based on the binarizations of the P slice prediction type syntax element, the B slice prediction type syntax element, and the I slice prediction type syntax element, wherein each of the first prediction type, second prediction type, and third prediction type specifies a respective prediction mode and a respective partition type.

26. The non-transitory computer-readable storage medium of claim 25, wherein the instructions further cause the one or more processors to:

binarize the P slice prediction type syntax element with the determined P slice binarization;

binarize the B slice prediction type syntax element with the determined B slice binarization;

binarize the I slice prediction type syntax element with the determined I slice binarization;

apply context adaptive binary arithmetic coding (CABAC) to the binarized P slice prediction type syntax element;

apply CABAC to the binarized B slice prediction type syntax element; and apply CABAC to the binarized I slice prediction type syntax element.

27. The non-transitory computer-readable storage medium of claim 25, wherein the prediction mode includes one of inter-prediction and intra-prediction.

28. The non-transitory computer-readable storage medium of claim 25, wherein the partition type includes one of symmetric partitions and asymmetric partitions.

29. A non-transitory computer-readable storage medium storing instructions that, when executed, cause one or more processors configured to decode video data to:

map a binarized P slice prediction type syntax element to a first prediction type using a first binarization mapping for a block of video data in a P slice;

map a binarized B slice prediction type syntax element to a second prediction type using the first binarization mapping for a block of video data in a B slice;

map a binarized I slice prediction type syntax element to a third prediction type using a second binarization mapping for a block of video data in an I slice, the second binarization mapping being different than the first binarization mapping, wherein each of the first prediction type, second prediction type, and third prediction type specifies a respective prediction mode and a respective partition type; and decode the video data based on the mapped first prediction type, second prediction type and third prediction type.

30. The non-transitory computer-readable storage medium of claim 29, wherein the instructions further cause the one or more processors to:

receive a context adaptive binary arithmetic coded P slice prediction type syntax element which indicates the first prediction type for the block of video data in the P slice;

receive a context adaptive binary arithmetic coded B slice prediction type syntax element which indicates the second prediction type for the block of video data in the B slice;

receive a context adaptive binary arithmetic coded I slice prediction type syntax element which indicates the third prediction type for the block of video data in the I slice;

decode the P slice prediction type syntax element to produce the binarized P slice prediction type syntax element;

decode the B slice prediction type syntax element to produce the binarized B slice prediction type syntax element; and decode the I slice prediction type syntax element to produce the binarized I slice prediction type syntax element.

31. The non-transitory computer-readable storage medium of claim 29, wherein the prediction mode includes one of inter-prediction and intra-prediction.

32. The non-transitory computer-readable storage medium of claim 29, wherein the partition type includes one of symmetric partitions and asymmetric partitions.

* * * * *